US012626764B2

(12) United States Patent
Nagashima

(10) Patent No.: US 12,626,764 B2
(45) Date of Patent: May 12, 2026

(54) SEMICONDUCTOR MEMORY DEVICE AND METHOD OF MANUFACTURING SEMICONDUCTOR MEMORY DEVICE

(71) Applicant: Kioxia Corporation, Tokyo (JP)

(72) Inventor: Satoshi Nagashima, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 446 days.

(21) Appl. No.: 18/460,203

(22) Filed: Sep. 1, 2023

(65) Prior Publication Data

US 2024/0096418 A1     Mar. 21, 2024

(30) Foreign Application Priority Data

Sep. 20, 2022     (JP) ................................. 2022-149186

(51) Int. Cl.
| | |
|---|---|
| *G11C 16/04* | (2006.01) |
| *H10B 41/10* | (2023.01) |
| *H10B 41/27* | (2023.01) |
| *H10B 41/35* | (2023.01) |
| *H10B 43/10* | (2023.01) |

(Continued)

(52) U.S. Cl.
CPC ......... *G11C 16/0483* (2013.01); *H10B 41/10* (2023.02); *H10B 41/27* (2023.02); *H10B 41/35* (2023.02); *H10B 43/10* (2023.02); *H10B 43/27* (2023.02); *H10B 43/35* (2023.02)

(58) Field of Classification Search
CPC .... G11C 16/0483; H10B 41/10; H10B 41/27; H10B 41/35; H10B 43/10; H10B 43/27; H10B 43/35; H10B 43/40; H10B 43/50
See application file for complete search history.

(56) References Cited

U.S. PATENT DOCUMENTS

| | | | | |
|---|---|---|---|---|
| 11,121,143 | B2 * | 9/2021 | Luo ................... | G11C 16/0483 |
| 2010/0013049 | A1 | 1/2010 | Tanaka et al. | |
| 2018/0144977 | A1 | 5/2018 | Yu et al. | |

(Continued)

FOREIGN PATENT DOCUMENTS

| | | | | |
|---|---|---|---|---|
| CN | 112119497 A | * 12/2020 | ............. | H01L 25/50 |
| JP | 2010-027870 A | 2/2010 | | |

(Continued)

*Primary Examiner* — Mamadou L Diallo
(74) *Attorney, Agent, or Firm* — Foley & Lardner LLP

(57) ABSTRACT
A semiconductor memory device includes a first stacked body, a second stacked body, an interposed portion, and a columnar body. The interposed portion is disposed between the first stacked body and the second stacked body. The columnar body includes a first columnar portion extending in a first direction inside the first stacked body, a second columnar portion extending in the first direction inside the second stacked body, and a connection portion disposed in the interposed portion and connecting the first columnar portion to the second columnar portion. At least part of the interposed portion has a first layer containing a first insulating material, a second layer disposed between the first layer and the second stacked body in the first direction and containing the first insulating material, and a third layer disposed between the first layer and the second layer in the first direction and containing a first material different from the first insulating material.

20 Claims, 33 Drawing Sheets

(51) Int. Cl.
  H10B 43/27      (2023.01)
  H10B 43/35      (2023.01)

(56)              References Cited

U.S. PATENT DOCUMENTS

| | | | |
|---|---|---|---|
| 2019/0088676 A1* | 3/2019 | Tagami ................. | H10B 43/40 |
| 2019/0296034 A1* | 9/2019 | Nagashima ............ | H10B 43/40 |
| 2020/0091185 A1 | 3/2020 | Baek | |
| 2020/0098784 A1* | 3/2020 | Nagashima ....... | H01L 21/31116 |
| 2020/0251490 A1* | 8/2020 | Matsumoto ......... | H01L 23/5226 |
| 2022/0036931 A1 | 2/2022 | Lin et al. | |
| 2022/0085062 A1* | 3/2022 | Unno ..................... | H10B 41/10 |
| 2025/0280540 A1* | 9/2025 | Jang ....................... | H10B 43/27 |

FOREIGN PATENT DOCUMENTS

| | | | |
|---|---|---|---|
| JP | 2020-126943 A | 8/2020 | |
| JP | 2022-027627 A | 2/2022 | |

* cited by examiner (f)

(g)

(a)

(b)

(c)

(p)

( g )

( h )

SEMICONDUCTOR MEMORY DEVICE AND METHOD OF MANUFACTURING SEMICONDUCTOR MEMORY DEVICE

CROSS-REFERENCE TO RELATED APPLICATION(S)

This application is based upon and claims the benefit of priority from Japanese Patent Application No. 2022-149186, filed Sep. 20, 2022, the entire contents of which are incorporated herein by reference.

FIELD

Embodiments described herein relate generally to a semiconductor memory device and a method of manufacturing a semiconductor memory device.

BACKGROUND

There is a semiconductor memory device that has a stacked body in which word lines and insulating layers are alternately stacked, and a memory pillar penetrating through the stacked body.

DETAILED DESCRIPTION

Figure 1:
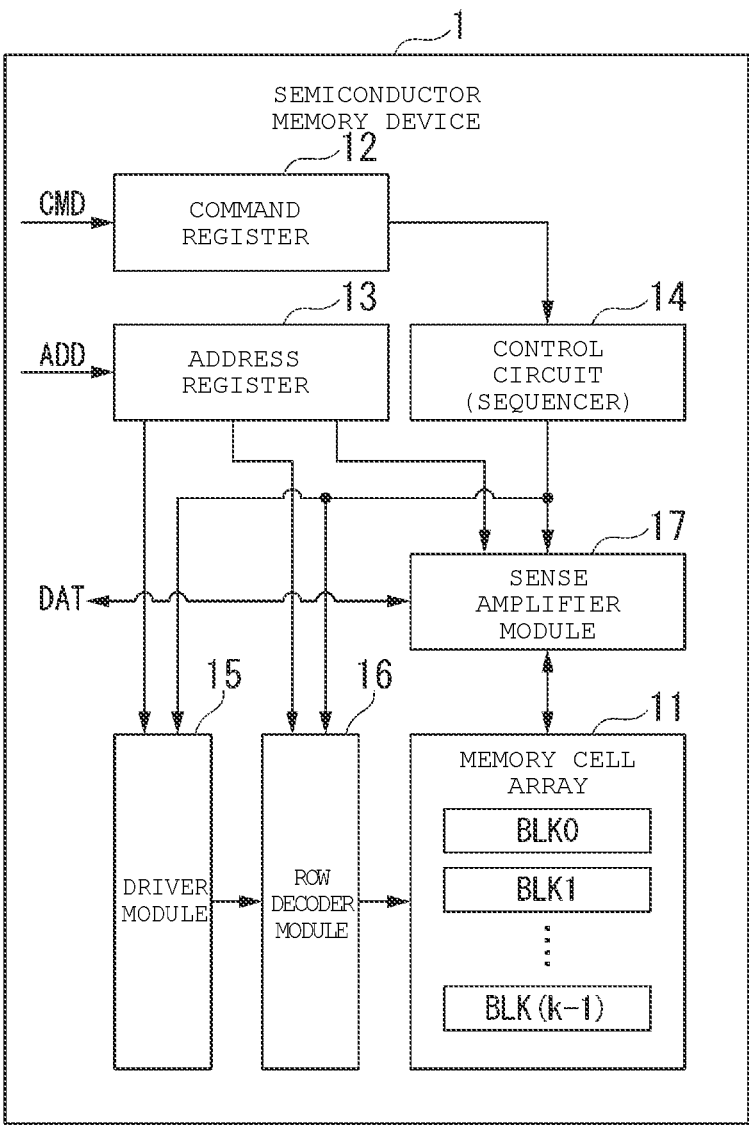
FIG. 1 is a block diagram showing a configuration of a semiconductor memory device according to a first embodiment.

Embodiments provide a semiconductor memory device and a method of manufacturing a semiconductor memory device that can improve manufacturability.

In general, according to at least one embodiment, a semiconductor memory device has a first stacked body, a second stacked body, an interposed portion, a columnar body, a first contact, and a second contact. The first stacked body is provided in a first region and a second region when viewed from a first direction, in which a plurality of first gate electrode layers and a plurality of first insulating layers are alternately stacked one by one in the first direction. The second stacked body is disposed at a position different from a position of the first stacked body in the first direction and in which a plurality of second gate electrode layers and a plurality of second insulating layers are alternately stacked one by one in the first direction. The interposed portion is disposed between the first stacked body and the second stacked body in the first direction. The columnar body has a channel layer and a memory film, and includes a first columnar portion extending in the first direction inside the first stacked body, a second columnar portion extending in the first direction inside the second stacked body, and a connection portion having a step disposed in the interposed portion and connecting the first columnar portion to the second columnar portion, the step being a step having different widths in a second direction intersecting the first direction between the interposed portion and the second columnar portion. The columnar body is provided in the first region. The first contact is provided in the second region and is in contact with one of the plurality of first gate electrode layers. The second contact is provided in the second region and is in contact with one of the plurality of third gate electrode layers. The interposed portion has a thickness in the first direction larger than a thickness of the first insulating layer in both the first region and the second region. At least part of the interposed portion has a first layer containing a first insulating material, a second layer disposed between the first layer and the second stacked body in the first direction and containing the first insulating material, and a third layer disposed between the first layer and the second layer in the first direction and containing a first material different from the first insulating material.

A semiconductor memory device and a method of manufacturing a semiconductor memory device according to at least one embodiment will be described below with reference to the drawings. In the following description, elements having the same or similar functions are denoted by the same reference numerals. The duplicate description of those elements may be omitted. In the following description, reference numerals that end with numbers or letters for distinction may be omitted if they do not need to be distinguished from each other.

Terms are defined as follows in the present application. "Parallel", "orthogonal", or "same" may include "substantially parallel", "substantially orthogonal", or "substantially the same" respectively. "Connection" is not limited to mechanical connection, and may include electrical connection. That is, "connection" is not limited to a case where two elements that are connection targets are directly connected, but may include a case where two elements that are connection targets are connected with another element interposed therebetween. The term "adjacent" is not limited to a case where two elements are in contact with each other, but may include the case where two elements are separated from each other (for example, a case where another element is interposed between two elements). "Layer" and "film" are terms used interchangeably for the sake of distinguishing elements, and mean substantially the same thing.

Therefore, "layer" and "film" may be read interchangeably in the following description.

X, Y and Z directions are defined as follows. The X direction is a direction in which a word line WL (refer to FIG. 3) that will be described later extends. The Y direction is a direction that intersects (for example, is orthogonal to) the X direction. The Y direction is a direction in which the bit line BL (refer to FIG. 4) that will be described later extends. The Z direction is a direction that intersects (for example, is orthogonal to) the X and Y directions. In the following description, a side on which a second stacked body 40B is located when viewed from a first stacked body 40A may be referred to as "upper", and an opposite side may be referred to as "lower". Also, in the following description, a position in the Z direction may be referred to as a "height". Here, these expressions are for convenience only and do not specify the direction of gravity. The Z direction is an example of a "first direction". The X direction is an example of a "second direction".

First Embodiment

1. Configuration of Semiconductor Memory Device

FIG. 1 is a block diagram showing a part of a configuration of a semiconductor memory device 1. The semiconductor memory device 1 is, for example, a non-volatile semiconductor memory device such as a NAND flash memory. The semiconductor memory device 1 can be connected to, for example, an external host device and used as a storage space of the host device. The semiconductor memory device 1 is provided with, for example, a memory cell array 11, a command register 12, an address register 13, a control circuit (sequencer) 14, a driver module 15, a row decoder module 16, and a sense amplifier module 17.

The memory cell array 11 includes a plurality of blocks BLK0 to BLK(k−1) (where k is an integer of 1 or more). The block BLK is a set including memory cell transistors that store data in a non-volatile manner. The block BLK is used, for example, as a data erasing unit. The memory cell array 11 is provided with a plurality of bit lines and a plurality of word lines. Each memory cell transistor is associated with one bit line and one word line.

The command register 12 stores a command CMD that the semiconductor memory device 1 receives from a host device. The address register 13 stores address information ADD that the semiconductor memory device 1 receives from the host device. The control circuit 14 is a circuit that controls various operations of the semiconductor memory device 1. For example, the control circuit 14 executes a data write operation, read operation, or erasing operation on the basis of the command CMD stored in the command register 12.

The driver module 15 includes a voltage generation circuit and generates voltages used in various operations of the semiconductor memory device 1. The row decoder module 16 transfers a voltage applied to a signal line corresponding to a selected word line to the selected word line. The sense amplifier module 17 applies a desired voltage to each bit line in a write operation. In a read operation, the sense amplifier module 17 determines a data value stored in each memory cell transistor on the basis of the voltage of each bit line, and transfers the determination result as read data DAT to the host device.

2. Electrical Configuration of Memory Cell Array

Next, an electrical configuration of the memory cell array 11 will be described.

Figure 2:
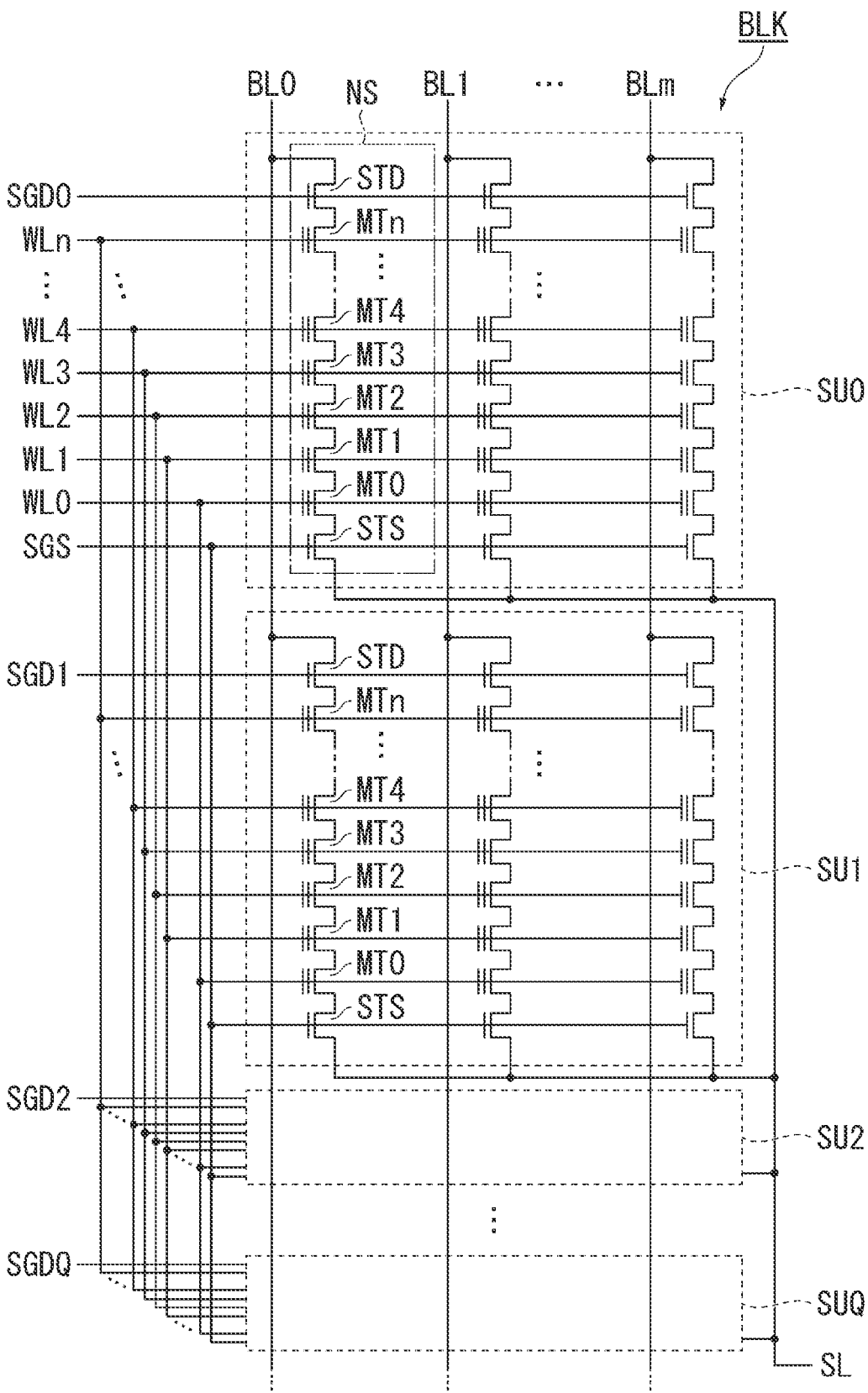
FIG. 2 is a diagram showing an equivalent circuit of a part of a memory cell array of the first embodiment.

FIG. 2 is a diagram showing an equivalent circuit of a part of the memory cell array 11. FIG. 2 shows one block BLK in the memory cell array 11. The block BLK includes a plurality of string units SU0 to SUQ (where Q is an integer of 1 or more).

Each string unit SU includes a plurality of NAND strings NS associated with bit lines BL0 to BLm (where m is an integer of 1 or more). Each NAND string NS includes, for example, a plurality of memory cell transistors MT0 to MTn (where n is an integer of 1 or more), one or more drain-side select transistors STD, and one or more source-side select transistors STS.

In each NAND string NS, the memory cell transistors MT0 to MTn are connected in series. Each memory cell transistor MT includes a control gate and a charge storage portion. The control gate of the memory cell transistor MT is connected to one of the word lines WL0 to WLn. In each memory cell transistor MT, electric charge is stored in the charge storage portion according to a voltage applied to the control gate via the word line WL, and a data value is stored in a non-volatile manner.

A drain of the drain-side select transistor STD is connected to the corresponding bit line BL corresponding to the NAND strings NS. A source of the drain-side select transistor STD is connected to one end of the memory cell transistors MT0 to MTn connected in series. A control gate of the drain-side select transistor STD is connected to one of the drain-side select gate lines SGD0 to SGDQ. The drain-side select transistor STD is electrically connected to the row decoder module 16 via the drain-side select gate line SGD. The drain-side select transistor STD connects the NAND string NS to the bit line BL when a predetermined voltage is applied to the corresponding drain-side select gate line SGD.

A drain of the source-side select transistor STS is connected to the other end of the memory cell transistors MT0 to MTn connected in series. A source of the source-side select transistor STS is connected to a source line SL. A control gate of the source-side select transistor STS is connected to a source-side select gate line SGS. The source-side select transistor STS connects the NAND string NS to the source line SL when a predetermined voltage is applied to the source-side select gate line SGS.

In the same block BLK, the control gates of the memory cell transistors MT0 to MTn are commonly connected to the word lines WL0 to WLn, respectively. The control gates of the drain-side select transistors STD in the string units SU0 to SUQ are commonly connected to the corresponding select gate lines SGD0 to SGDQ, respectively. The control gates of the source-side select transistors STS are commonly connected to a select gate line SGS. In the memory cell array 11, the bit line BL is shared by the NAND strings NS to which the same column address is assigned in each string unit SU.

3. Physical Configuration of Memory Cell Array

Next, a physical configuration of the memory cell array 11 will be described.

Figure 3:
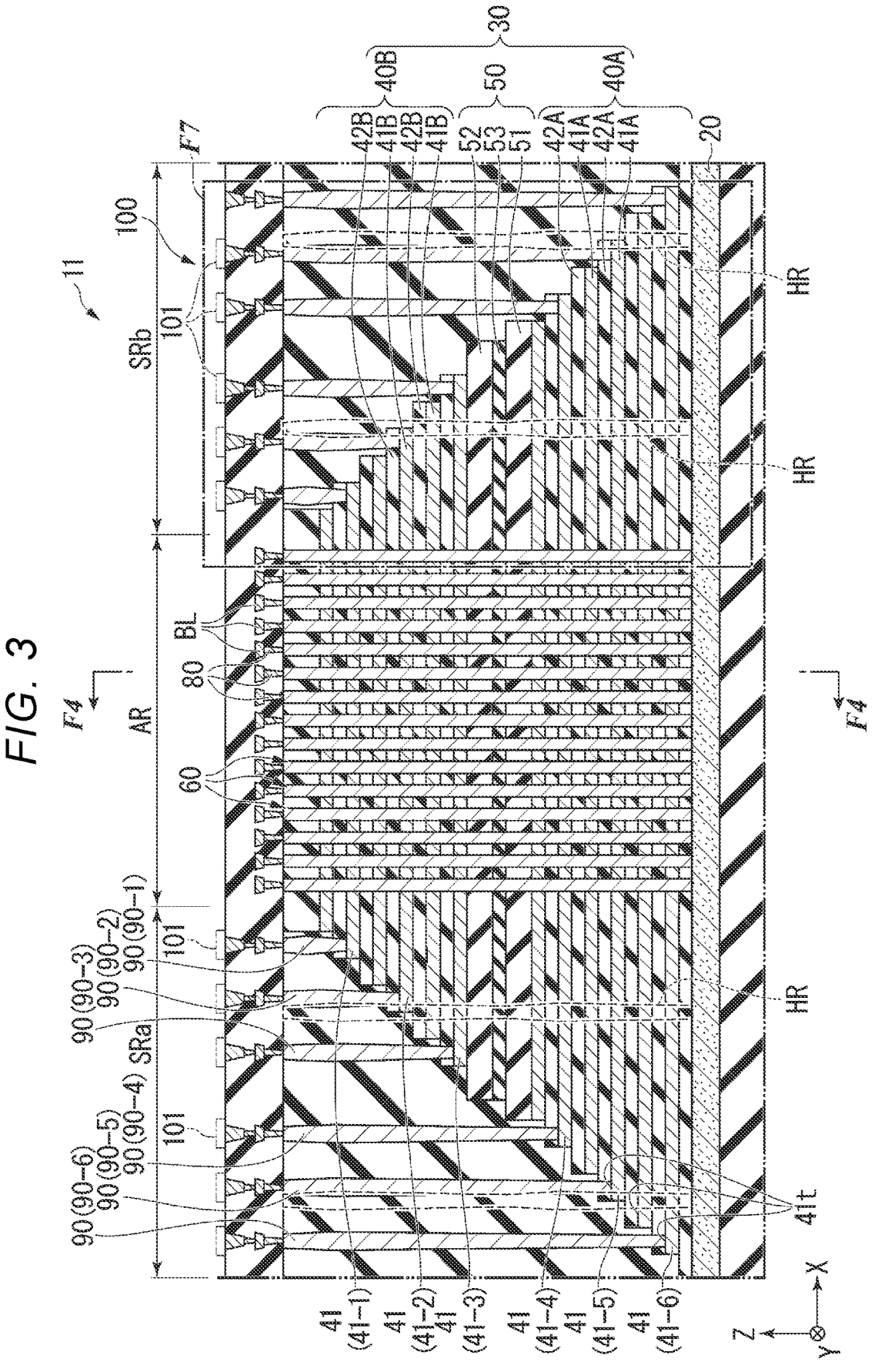
FIG. 3 is a sectional view showing a part of the memory cell array of the first embodiment.

FIG. 3 is a sectional view showing a part of the memory cell array 11. The memory cell array 11 includes, for example, a lower structural body 20, a stacked body 30, a plurality of memory pillars 60, one or more dividing portions 70 (refer to FIG. 4), a plurality of contacts 80 for memory pillars, and a plurality of contacts 90 for conductive layers, a support HR, and an upper wiring portion 100.

3.1 Lower Structural Body

First, the lower structural body 20 will be described.

Figure 4:
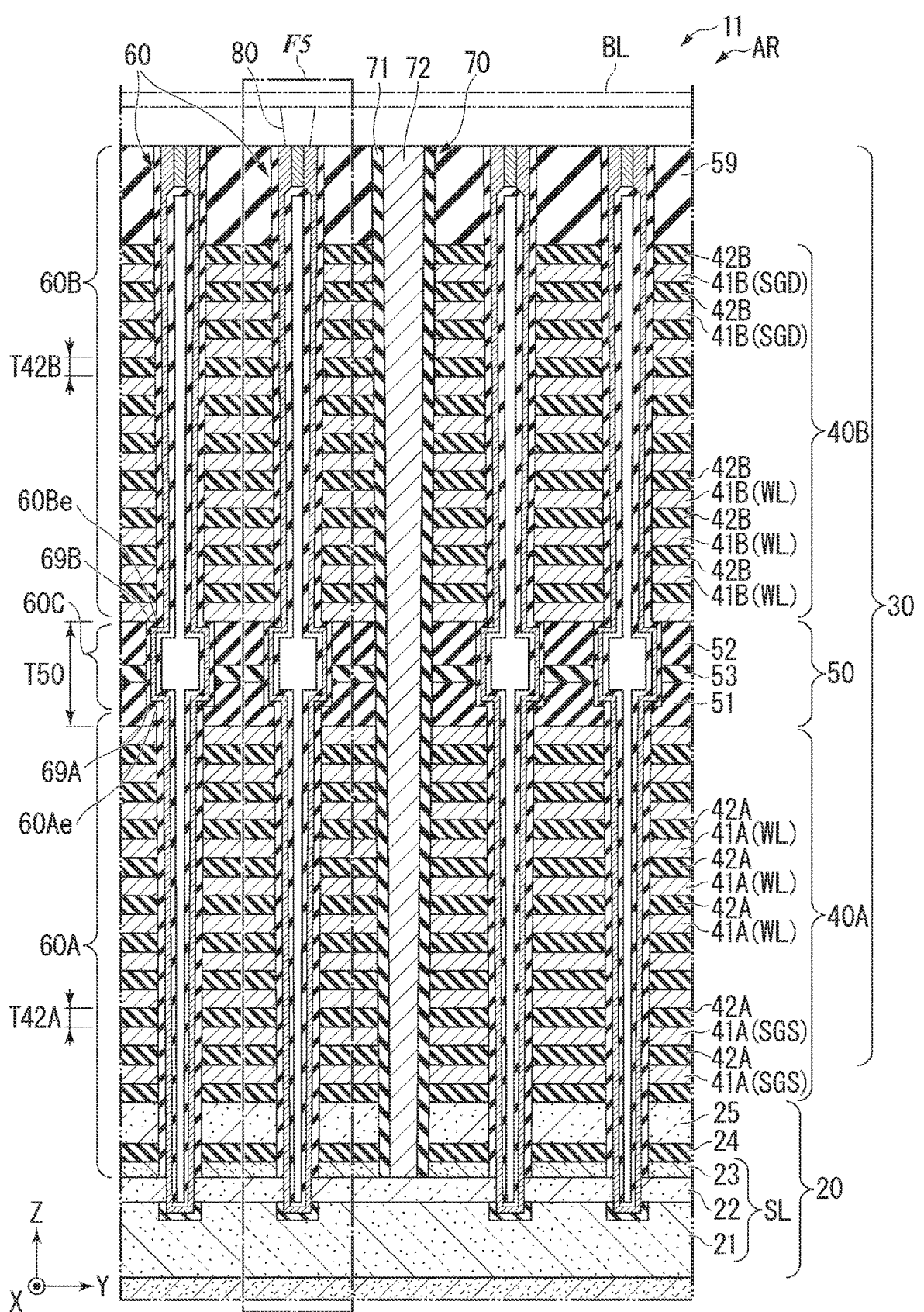
FIG. 4 is a sectional view along the line IV-IV of a part of the memory cell array shown in FIG. 3.

FIG. 4 is a sectional view along the line IV-IV of a part of the memory cell array 11 shown in FIG. 3. The lower structural body 20 includes, for example, a first semiconductor layer 21, a second semiconductor layer 22, a third semiconductor layer 23, an insulating layer 24 and a fourth semiconductor layer 25.

The first semiconductor layer 21 is a layer made of a semiconductor material such as polysilicon. The first semiconductor layer 21 contains impurities and has conductivity. The first semiconductor layer 21 extends in the X direction and the Y direction.

The second semiconductor layer 22 is provided on the first semiconductor layer 21. The second semiconductor layer 22 is a layer made of a semiconductor material such as polysilicon. The second semiconductor layer 22 contains impurities and has conductivity. The second semiconductor layer 22 extends in the X direction and the Y direction.

The third semiconductor layer 23 is provided on the second semiconductor layer 22. The third semiconductor layer 23 is a layer made of a semiconductor material such as polysilicon. The third semiconductor layer 23 contains impurities and has conductivity. The third semiconductor layer 23 extends in the X direction and the Y direction. A thickness of the third semiconductor layer 23 is, for example, smaller than a thickness of the first semiconductor layer 21 and a thickness of the second semiconductor layer 22. In the present embodiment, the first semiconductor layer 21, the second semiconductor layer 22, and the third semiconductor layer 23 form the source line SL.

The insulating layer 24 is provided on the third semiconductor layer 23. The insulating layer 24 is a layer made of an insulating material such as silicon oxide. The insulating layer 24 extends in the X and Y directions.

The fourth semiconductor layer 25 is provided on the insulating layer 24. The fourth semiconductor layer 25 is a layer that functions as a stopper layer when a groove is formed in a stacked body 30 that will be described later. The fourth semiconductor layer 25 is made of a semiconductor material such as polysilicon. A stopper layer made of an insulating material may be provided instead of the fourth semiconductor layer 25.

3.2 Stacked Body

Next, the stacked body 30 will be described. The stacked body 30 includes a first stacked body 40A, a second stacked body 40B, an interposed portion 50, and an insulating layer 59.

3.2.1 First Stacked Body

First, the first stacked body 40A will be described. The first stacked body 40A is provided on the lower structural body 20. The first stacked body 40A includes a plurality of conductive layers 41A and a plurality of insulating layers 42A. The plurality of conductive layers 41A and the plurality of insulating layers 42A are alternately stacked one by one in the Z direction.

The conductive layer 41A is a layer along the X direction and the Y direction. The conductive layer 41A is made of a conductive material such as tungsten or molybdenum. The conductive layer 41A is an example of a "first gate electrode layer".

The insulating layer 42A is an interlayer insulating film provided between two conductive layers 41A adjacent in the Z direction and insulating the two conductive layers 41A. The insulating layer 42A is a layer along the X direction and the Y direction. The insulating layer 42A is made of an insulating material such as silicon oxide ($SiO_2$). The insulating layer 42A is an example of each of a "first insulating layer" and a "second film".

3.2.2 Second Stacked Body

Next, the second stacked body 40B will be described. The second stacked body 40B is disposed in the Z direction at a position different from that of the first stacked body 40A. In the present embodiment, the second stacked body 40B is disposed above the first stacked body 40A. The second stacked body 40B includes, for example, a plurality of conductive layers 41B and a plurality of insulating layers 42B. The plurality of conductive layers 41B and the plurality of insulating layers 42B are alternately stacked one by one in the Z direction.

The conductive layer 41B is a layer along the X direction and the Y direction. The conductive layer 41B is made of a conductive material such as tungsten or molybdenum. The conductive layer 41B is an example of a "second gate electrode layer".

The insulating layer 42B is an interlayer insulating film provided between two conductive layers 41B adjacent in the Z direction and insulating the two conductive layers 41B.

The insulating layer 42B is a layer along the X direction and the Y direction. The insulating layer 42B is made of an insulating material (SiO$_2$) such as silicon oxide. The insulating layer 42B is an example of each of a "second insulating layer" and a "fourth film".

3.2.3 Interposed Portion

Next, the interposed portion 50 will be described. The interposed portion 50 is disposed between the first stacked body 40A and the second stacked body 40B in the Z direction. The interposed portion 50 is a layer in which a connection portion 60C of the memory pillars 60 that will be described later is provided. The interposed portion 50 is a layer along the X direction and the Y direction. A Z-direction thickness T50 of the interposed portion 50 is larger than a Z-direction thickness T42A of the insulating layer 42A of the first stacked body 40A, and is larger than a Z-direction thickness T42B of the insulating layer 42B of the second stacked body 40B. A configuration of the interposed portion 50 will be described later in detail.

3.2.4 Insulating Layer

The insulating layer 59 is provided above the second stacked body 40B. The insulating layer 59 is made of silicon oxide (SiO$_2$), for example. The insulating layer 59 extends in the X and Y directions.

3.2.5 Electrical Configuration of Stacked Body

Next, an electrical configuration of the stacked body 30 will be described. Hereinafter, the conductive layer 41A of the first stacked body 40A and the conductive layer 41B of the second stacked body 40B will be simply referred to as "conductive layers 41" when not distinguished from each other. Similarly, the insulating layer 42A of the first stacked body 40A and the insulating layer 42B of the second stacked body 40B will be simply referred to as "insulating layer 42" when not distinguished from each other.

Among the plurality of conductive layers 41, one or more (for example, plural) conductive layers 41 farthest from the lower structural body 20 function as the drain-side select gate lines SGD. The drain-side select gate line SGD is provided in common for the plurality of memory pillars 60 disposed in the X direction or the Y direction. An intersection between the drain-side select gate line SGD and a channel layer 62 (that will be described later) of each memory pillar 60 functions as the above drain-side select transistor STD.

Among the plurality of conductive layers 41, one or more (for example, plural) conductive layers 41 closest to the lower structural body 20 function as the source-side select gate lines SGS. The source-side select gate line SGS is provided in common for the plurality of memory pillars 60 arranged in the X direction or the Y direction. An intersection between the source-side select gate line SGS and the channel layer 62 of each memory pillar 60 functions as the above source-side select transistor STS.

Among the plurality of conductive layers 41, the remaining conductive layers 41 interposed between the conductive layers 41 functioning as the drain-side select gate line SGD or the source-side select gate line SGS function as the word lines WL. The word line WL is provided in common for a plurality of memory pillars 60 arranged in the X direction and the Y direction. In the present embodiment, an intersection between the word line WL and the channel layer 62 of each memory pillar 60 functions as the memory cell transistor MT. The memory cell transistor MT will be described later in detail.

3.2.6 Array Region and Staircase Region

Referring to FIG. 3 again, several regions of the stacked body 30 will be described. The stacked body 30 has, for example, an array region AR and a pair of staircase regions SRa and SRb.

The array region AR is a region in which the plurality of memory pillars 60 that will be described later are provided and data can be stored. The array region AR is an example of a "first region".

Each of the staircase regions SRa and SRb is a region in which the plurality of conductive layers 41 have different lengths in the X direction and the plurality of contacts 90 for the conductive layers are provided. The staircase regions SRa and SRb are disposed separately on both sides of the array region AR in the X direction, for example. In the staircase regions SRa and SRb, the conductive layers 41 become longer toward the lower conductive layers 41 in the X direction. The X-direction end of each conductive layer 41 has, for example, a terrace portion 41$t$ that does not overlap other conductive layers 41 located above the conductive layer 41. Each of the staircase regions SRa and SRb is an example of a "second region".

For example, the plurality of conductive layers 41B of the second stacked body 40B include two or more conductive layers 41B having mutually different lengths in the X direction. For example, the plurality of conductive layers 41B include a first conductive layer 41-1, a second conductive layer 41-2, and a third conductive layer 41-3. The first conductive layer 41-1 is located at the highest position among the three conductive layers 41-1, 41-2, and 41-3. The second conductive layer 41-2 is located in the middle among the three conductive layers 41-1, 41-2, and 41-3. In other words, the second conductive layer 41-2 is disposed between the first conductive layer 41-1 and the first stacked body 40A. The third conductive layer 41-3 is located at the lowest position among the three conductive layers 41-1, 41-2, and 41-3. In other words, the third conductive layer 41-3 is disposed between the second conductive layer 41-2 and the first stacked body 40A. The X-direction length of the second conductive layer 41-2 is larger than the X-direction length of the first conductive layer 41-1. The X-direction length of the third conductive layer 41-3 is larger than the X-direction length of the second conductive layer 41-2.

Similarly, the plurality of conductive layers 41A of the first stacked body 40A includes two or more conductive layers 41A having mutually different lengths in the X direction. The plurality of conductive layers 41A include a fourth conductive layer 41-4, a fifth conductive layer 41-5, and a sixth conductive layer 41-6. The fourth conductive layer 41-4 is located at the highest position among these three conductive layers 41-4, 41-5 and 41-6. The fifth conductive layer 41-5 is located in the middle among the three conductive layers 41-4, 41-5, and 41-6. In other words, the fifth conductive layer 41-5 is disposed between the fourth conductive layer 41-4 and the lower structural body 20. The sixth conductive layer 41-6 is located at the lowest position among the three conductive layers 41-4, 41-5 and 41-6. In other words, the sixth conductive layer 41-6 is disposed between the fifth conductive layer 41-5 and the lower structural body 20. The X-direction length of the fourth conductive layer 41-4 is larger than the X-direction length of the third conductive layer 41-3 of the second stacked body 40B. The X-direction length of the fifth conductive layer 41-5 is larger than the X-direction length of the fourth conductive layer 41-4. The X-direction length of the sixth conductive layer 41-6 is larger than the X-direction length of the fifth conductive layer 41-5.

3.3 Memory Pillar

Next, the memory pillar 60 will be described.

As shown in FIG. 3, the plurality of memory pillars 60 are provided in the array region AR. The plurality of memory pillars 60 are arranged in the X direction and the Y direction.

As shown in FIG. 4, each memory pillar 60 extends in the Z direction and penetrates through the stacked body 30, the insulating layer 24, the third semiconductor layer 23, and the second semiconductor layer 22. The lower end of each memory pillar 60 is recessed into the first semiconductor layer 21. The memory pillar 60 is an example of a "columnar body".

In the present embodiment, each memory pillar 60 is a two-stage pillar and includes a lower pillar 60A, an upper pillar 60B, and a connection portion 60C. The lower pillar 60A extends in the Z direction inside the first stacked body 40A. The lower pillar 60A has, for example, a cylindrical shape or an inverted truncated cone shape. The lower pillar 60A is an example of a "first columnar portion". The upper pillar 60B extends in the Z direction inside the second stacked body 40B. The upper pillar 60B has, for example, a cylindrical shape or an inverted truncated cone shape. The upper pillar 60B is an example of a "second columnar portion".

The connection portion 60C is disposed inside the interposed portion 50. The connection portion 60C is provided between the lower pillar 60A and the upper pillar 60B in the Z direction, and connects the lower pillar 60A to the upper pillar 60B. The connection portion 60C has a width in the X direction and the Y direction larger than that of at least a part of the upper pillar 60B (for example, the lower end 60Be of the upper pillar 60B). The connection portion 60C has a step 69B with different widths in the X direction and the Y direction between the connection portion 60C and the upper pillar 60B. The connection portion 60C has a width in the X direction and the Y direction that are larger than that of at least a part of the lower pillar 60A (for example, the upper end 60Ae of the lower pillar 60A). The connection portion 60C has a step 69A with different widths in the X direction and the Y direction between the connection portion 60C and the lower pillar 60A.

Next, an internal configuration of the memory pillar 60 will be described.

Figure 5:
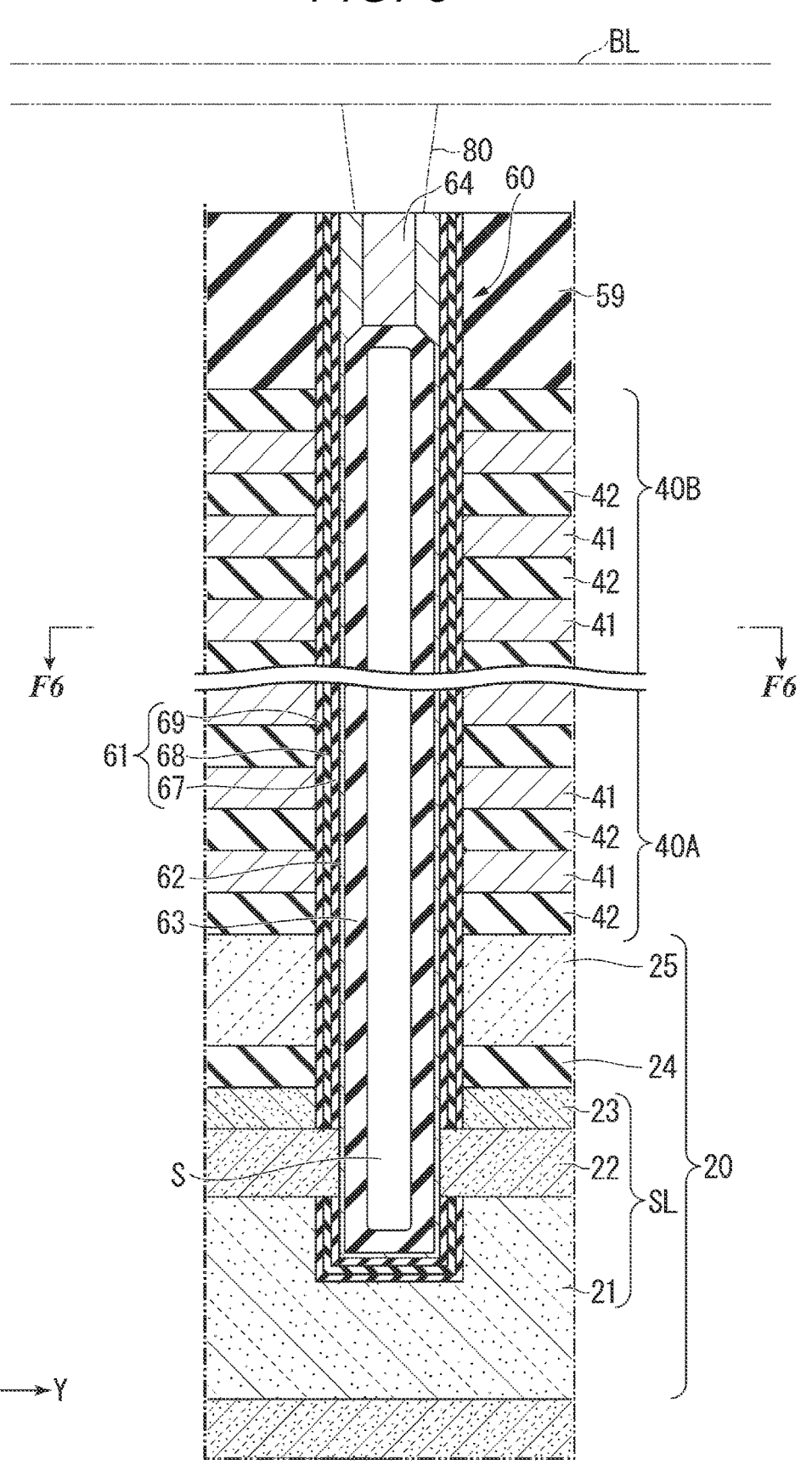
FIG. 5 is a sectional view showing a region surrounded by the line F5 of the memory cell array shown in FIG. 4.
Figure 6:
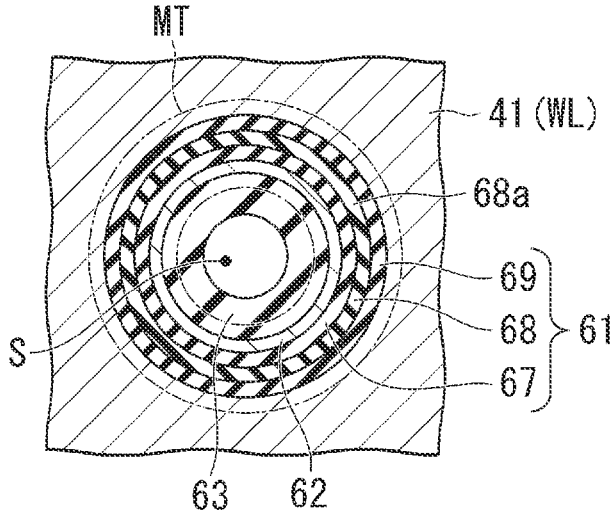
FIG. 6 is a sectional view along the line VI-VI of the memory cell array shown in FIG. 5.

FIG. 5 is a sectional view showing a region surrounded by line F5 of memory cell array 11 shown in FIG. 4. The memory pillar 60 has, for example, a memory film 61, a channel layer 62, an insulating core 63, and a cap portion 64.
Memory Film FIG. 6 is a sectional view along the line VI-VI of the memory cell array 11 shown in FIG. 5. The memory film 61 is provided on the outer circumferential side of the channel layer 62. The memory film 61 is disposed between the plurality of conductive layers 41 and the channel layer 62. The memory film 61 is formed in an annular shape and extends in the Z direction over the entire length (total height) of the memory pillar 60. The memory film 61 includes, for example, a tunnel insulating film 67, a charge trap film 68, and a block insulating film 69.

The tunnel insulating film 67 is located between the channel layer 62 and the charge trap film 68. The tunnel insulating film 67 is formed, for example, in an annular shape along the outer circumferential surface of the channel layer 62 and extends in the Z direction along the channel layer 62. The tunnel insulating film 67 is a potential barrier between the channel layer 62 and the charge trap film 68. The tunnel insulating film 67 contains silicon oxide, or silicon oxide and silicon nitride.

The charge trap film 68 is provided on the outer circumferential side of the tunnel insulating film 67. The charge trap film 68 is disposed between the tunnel insulating film 67 and the block insulating film 69. The charge trap film 68 is formed, for example, in an annular shape along the outer circumferential surface of the tunnel insulating film 67 and extends in the Z direction along the tunnel insulating film 67. The charge trap film 68 is a functional film that has many crystal defects (trapping levels) and can trap electric charge in these crystal defects. The charge trap film 68 is made of silicon nitride, for example. A portion 68a of the charge trap film 68, which is aligned with each word line WL, is an example of a "charge storage portion" capable of storing information by storing electric charge.

The block insulating film 69 is provided on the outer circumferential side of the charge trap film 68. The block insulating film 69 is disposed between the plurality of conductive layers 41 and the charge trap film 68. The block insulating film 69 is formed, for example, in an annular shape along the outer circumferential surface of the charge trap film 68 and extends in the Z direction along the charge trap film 68. The block insulating film 69 is an insulating film that reduces back tunneling. Back tunneling is a phenomenon in which electric charge is injected from the word line WL to the charge trap film 68. The block insulating film 69 is, for example, a stacked structural film in which a plurality of insulating films such as silicon oxide films or metal oxide films are stacked. An example of a metal oxide is aluminum oxide. The block insulating film 69 may contain a high dielectric constant material (high-k material) such as silicon nitride or hafnium oxide.

With the above configuration, at the same height as each word line WL, the end of the word line WL, the block insulating film 69, the charge trap film 68, the tunnel insulating film 67, and the channel layer 62 adjacent to the memory pillar 60 form a metal-Al-nitride-oxide-silicon (MANOS) type memory cell transistor MT. The memory film 61 may have a floating gate type charge storage portion (floating gate electrode) instead of the charge trap film 68 as a charge storage portion. The floating gate electrode is made of polysilicon containing impurities, for example.
Channel Layer The channel layer 62 is provided inside the memory film 61. The channel layer 62 is formed in an annular shape and extends in the Z direction over the entire length (total height) of the memory pillar 60. In the present embodiment, a portion of the memory film 61 located at the same height as the source line SL is removed (refer to FIG. 5). Thus, the lower end of the channel layer 62 is in contact with and connected to the source line SL. The channel layer 62 is made of a semiconductor material such as polysilicon. The channel layer 62 may be doped with impurities. The channel layer 62 forms a channel to electrically connect the bit line BL to the source line SL when a voltage is applied to the word line WL.
Insulating Core The insulating core 63 is provided inside the channel layer 62. The insulating core 63 is filled with a part of the inside of the channel layer 62. The insulating core 63 is made of an insulating material such as silicon oxide. The insulating core 63 extends in the Z direction over most of the memory pillar 60 except for the upper end of the memory pillar 60. A part of the insulating core 63 may be formed in an annular shape along the inner circumferential surface of the channel layer 62 and have a space (air gap) S inside thereof.

Cap Portion

Referring to FIG. 5 again, the cap portion 64 will be described. The cap portion 64 is provided above the insulating core 63 (refer to FIG. 5). The cap portion 64 is a semiconductor portion made of a semiconductor material such as amorphous silicon or polysilicon. The cap portion 64 may be doped with impurities. The cap portion 64 is provided on the inner circumferential side of the upper end of the channel layer 62 and formed integrally with the channel layer 62. The cap portion 64 forms the upper end of the memory pillar 60 together with the upper end of the channel layer 62. The memory pillar contact 80 is in contact with the cap portion 64 in the Z direction.

3.4 Dividing Portion

Next, referring to FIG. 4 again, the dividing portion 70 will be described. The dividing portion 70 is a wall portion that divides the stacked body 30 in the Y direction. The plurality of dividing portions 70 (only one of which is shown in FIG. 4) are spaced apart from each other in the Y direction. The dividing portion 70 extends in the Z direction and penetrates through the stacked body 30. The dividing portion 70 extends in the X direction and extends over a pair of staircase regions SRa and SRb with the array region AR interposed therebetween. The dividing portion 70 includes, for example, an insulating portion 71 and a conductive portion 72.

The insulating portion 71 extends in the Z direction and penetrates through the stacked body 30, the insulating layer 24 and the third semiconductor layer 23. The insulating portion 71 divides each of the plurality of conductive layers 41 in the stacked body 30 in the Y direction. The insulating portion 71 is made of an insulating material such as silicon oxide.

The conductive portion 72 is provided inside the insulating portion 71. The conductive portion 72 extends in the Z direction and penetrates through the stacked body 30, the insulating layer 24, and the third semiconductor layer 23. A lower end of the conductive portion 72 is connected to the source line SL. The conductive portion 72 is made of a conductive material such as tungsten. The conductive portion 72 is an electrical connection portion that connects the source line SL to a wiring in the memory cell array 11.

3.5 Contact for Memory Pillar

Next, referring to FIG. 3 again, the contact 80 for the memory pillar will be described. The contact 80 is an electrical connection portion that connects the memory pillar 60 to the bit line BL in the upper wiring portion 100. The plurality of contacts 80 are disposed at positions corresponding to the plurality of memory pillars 60 when viewed from above. Each contact 80 extends in the Z direction and electrically connects the bit line BL to the cap portion 64 of the memory pillar 60.

3.6 Contact for Conductive Layer

Next, the contact 90 for the conductive layer will be described. The contact 90 is an electrical connection portion that connects the conductive layer 41 to a wiring 101 in the upper wiring portion 100. A plurality of contacts 90 are provided in the staircase regions SRa and SRb. The plurality of contacts 90 are disposed at positions corresponding to the terrace portions 41t of the plurality of conductive layers 41 when viewed from above. The plurality of contacts 90 extend in the Z direction and have different lengths in the Z direction.

For example, the plurality of contacts 90 include a contact 90-1, a contact 90-2, and a contact 90-3. The contact 90-1 corresponds to the terrace portion 41t of the first conductive layer 41-1 and is in contact with the terrace portion 41t of the first conductive layer 41-1. The contact 90-2 extends downward longer than the contact 90-1. The contact 90-2 corresponds to the terrace portion 41t of the second conductive layer 41-2 and is in contact with the terrace portion 41t of the second conductive layer 41-2. The contact 90-3 extends downward longer than the contact 90-2. The contact 90-3 corresponds to the terrace portion 41t of the third conductive layer 41-3 and is in contact with the terrace portion 41t of the third conductive layer 41-3.

The plurality of contacts 90 include a contact 90-4, a contact 90-5, and a contact 90-6. The contact 90-4 extends downward longer than the contact 90-3. The contact 90-4 corresponds to the terrace portion 41t of the fourth conductive layer 41-4 and is in contact with the terrace portion 41t of the fourth conductive layer 41-4. The contact 90-5 extends downward longer than the contact 90-4. The contact 90-5 corresponds to the terrace portion 41t of the fifth conductive layer 41-5 and is in contact with the terrace portion 41t of the fifth conductive layer 41-5. The contact 90-6 extends downward longer than the contact 90-5. The contact 90-6 corresponds to the terrace portion 41t of the sixth conductive layer 41-6 and is in contact with the terrace portion 41t of the sixth conductive layer 41-6.

3.7 Support

Next, the support HR will be described. The support HR is a columnar body extending in the Z direction inside the stacked body 30. The support HR may be made of, for example, an insulating material, or may have the same configuration as that of the memory pillar 60. A plurality of supports HR are provided in the staircase regions SRa and SRb. The support HR is a support portion that supports the plurality of insulating layers 42 in the staircase regions SRa and SRb in a state in which a sacrificial layer 121 is removed in a replacement step that will be described later.

3.8 Upper Wiring Portion

Next, the upper wiring portion 100 will be described. The upper wiring portion 100 includes a plurality of wirings 101 disposed above the stacked body 30. The upper wiring portion 100 includes, for example, a plurality of bit lines BL and a plurality of wirings 101.

Each bit line BL is disposed on the contact 80 for the corresponding memory pillar. The bit line BL is connected to the channel layer 62 of the memory pillar 60 via the contact 80. Thus, any memory cell transistor MT can be selected from among a plurality of memory cell transistors MT disposed three-dimensionally by combining the word lines WL and the bit lines BL.

Each wiring 101 is disposed on the contact 90 for the conductive layer that will be described later. The wiring 101 is connected to the conductive layer 41 (the word line WL, the drain-side select gate line SGD, or the source-side select gate line SGS) via the contact 90. Consequently, by applying a voltage to the wiring 101, the voltage can be applied to the desired conductive layer 41.

4. Configuration of Interposed Portion

Next, a configuration of the interposed portion 50 will be described.

Figure 7:
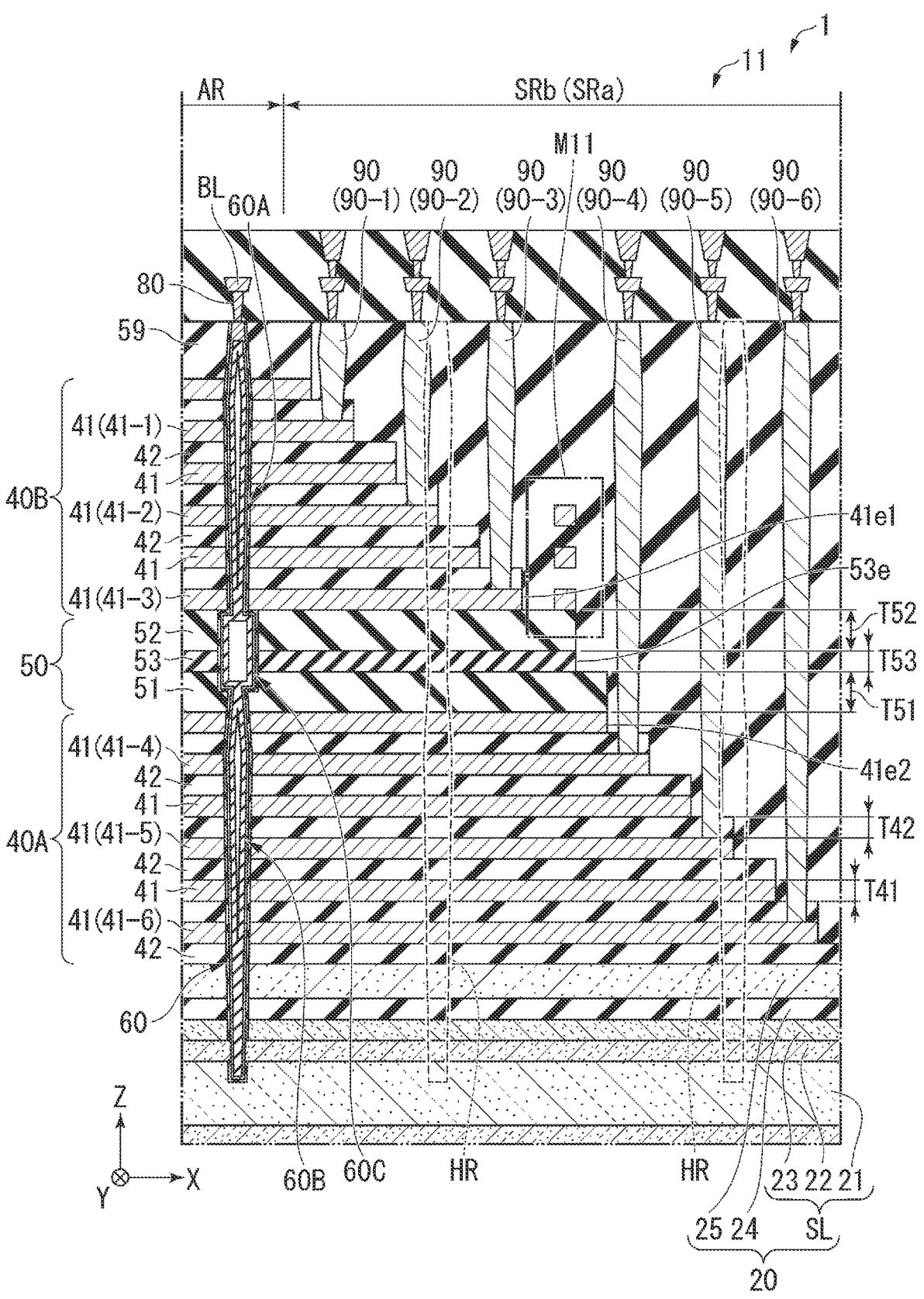
FIG. 7 is a sectional view showing a region surrounded by the line F7 of the memory cell array shown in FIG. 3.
Figure 13:
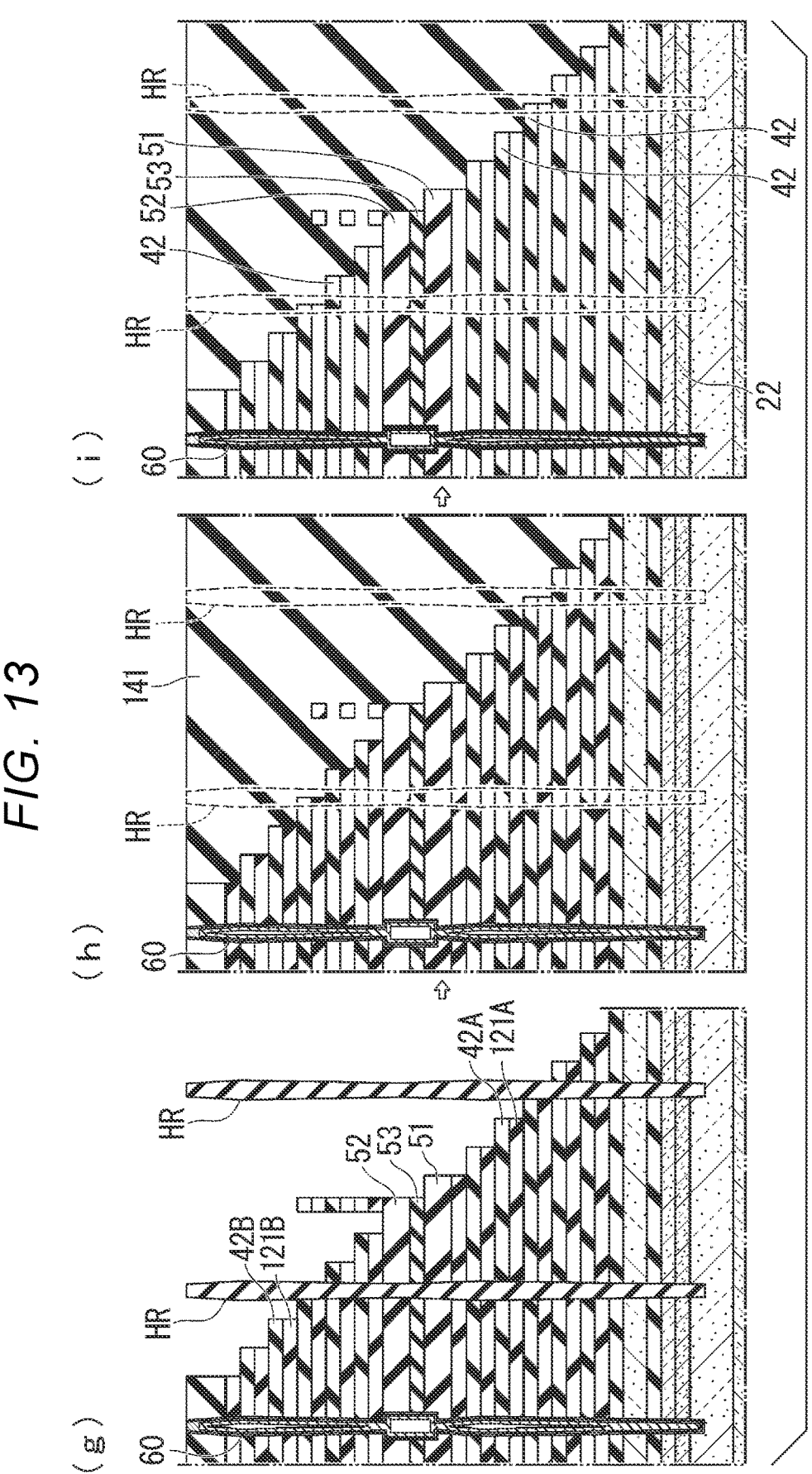
FIG. 13 is a sectional view showing the method of manufacturing the semiconductor memory device of the first embodiment.

FIG. 7 is a sectional view showing a region surrounded by line F7 of the memory cell array 11 shown in FIG. 3. It should be noted that a structure of the region surrounded by a dot chain line M11 in FIG. 7 includes a structure formed through a staircase region forming region including the slimming step shown in FIGS. 8 to 10 (in (g) of FIG. 10, a staircase structure as indicated by a dot chain line M12). However, in FIG. 7, for convenience of description, the structure of the region surrounded by the dot chain line M11 is simplified and illustrated. This also applies to FIGS. 13 and 14 showing the manufacturing method of the present embodiment, and some drawings referred to in the second embodiment and subsequent embodiments.

In the present embodiment, at least a part of the interposed portion 50 includes a first layer 51, a second layer 52, and a third layer 53.

4.1 First Layer

The first layer 51 is disposed on the first stacked body 40A. The first layer 51 is an insulating layer containing a first insulating material. The first insulating material contains, for example, oxygen. The first insulating material is, for example, silicon oxide ($SiO_2$) formed from tetraethyl orthosilicate (TEOS) ($Si(OC_2H_5)_4$)). The first layer 51 extends in the X and Y directions. A Z-direction thickness T51 of the first layer 51 is larger than, for example, the Z-direction thickness T42 of the insulating layer 42. However, the Z direction thickness T51 of the first layer 51 may be the same as the Z-direction thickness T42 of the insulating layer 42 or may be smaller than the Z-direction thickness T42 of the insulating layer 42.

4.2 Second Layer

The second layer 52 is disposed above the first layer 51 and located between the first layer 51 and the second stacked body 40B. The second layer 52 is an insulating layer containing the first insulating material. That is, the first layer 51 and the second layer 52 are made of the same insulating material. The second layer 52 extends in the X and Y directions. A Z-direction thickness T52 of the second layer 52 is larger than, for example, a Z-direction thickness T42 of the insulating layer 42. However, the Z-direction thickness T52 of the second layer 52 may be the same as the Z-direction thickness T42 of the insulating layer 42 or may be smaller than the Z-direction thickness T42 of the insulating layer 42.

4.3 Third Layer

Configuration of Third Layer

The third layer 53 is disposed between the first layer 51 and the second layer 52 in the Z direction. In the present embodiment, the third layer 53 is an insulating layer containing a second insulating material. The second insulating material is an insulating material different from the first insulating material. That is, the third layer 53 is made of a material different from that of the first layer 51 and the second layer 52.

The third layer 53 extends in the X and Y directions. A Z-direction thickness T53 of the third layer 53 is smaller than, for example, the Z-direction thickness T51 of the first layer 51 and smaller than the Z-direction thickness T52 of the second layer 52. For example, the Z-direction thickness T53 of the third layer 53 is closer to the Z-direction thickness T41 of the conductive layer 41 than the Z-direction thickness T51 of the first layer 51. In the present embodiment, the Z-direction thickness T53 of the third layer 53 is the same as the Z-direction thickness T41 of the conductive layer 41. However, the Z-direction thickness T53 of the third layer 53 may be larger or smaller than the Z-direction thickness T41 of the conductive layer 41.

The second insulating material has characteristics closer to silicon nitride (SiN) than the first insulating material with respect to a first etchant, and has characteristics closer to the first insulating material than silicon nitride (SiN) with respect to a second etchant different from the first etchant. For example, the second insulating material has a selectivity ratio closer to silicon nitride (SiN) than the first insulating material with respect to the first etchant, and has a selectivity ratio closer to the first insulating material than silicon nitride (SiN) with respect to the second etchant.

The first etchant is, for example, an etchant for performing etching for processing a plurality of sacrificial layers 121 (that will be described later) and a plurality of insulating layers 42 into desired shapes. The first etchant is, for example, a gas containing carbon and fluorine. The first etchant is, for example, a $C_xH_yF_z$ gas. Here, C represents carbon, H represents hydrogen, F represents fluorine, x is an integer of 1 or more, y is an integer of 0 or more, and z is an integer of 1 or more (where $x \geq 1$, $y \geq 0$, and $z \geq 1$). When $y=0$, $C_xH_yF_z$ is fluorocarbon, and when $y \neq 0$, $C_xH_yF_z$ is hydrofluorocarbon. The $C_xH_yF_z$ gas is, for example, a $C_4F_6$ gas, a $C_4F_8$ gas, or a $CH_2F_2$ gas.

The second etchant is, for example, an etchant used for removing the plurality of sacrificial layers 121 in the replacement step of replacing the plurality of sacrificial layers 121 with the plurality of conductive layers 41. The second etchant is, for example, a solution containing phosphoric acid. The second etchant is, for example, a solution containing hot phosphoric acid ($H_3PO_4$).

The second insulating material having the characteristics described above is, for example, an insulating material containing nitrogen. For example, the second insulating material is an insulating material containing carbon and nitrogen. The second insulating material is, for example, silicon carbonitride (SiCN). The second insulating material is an example of a "first material". For example, when the third layer 53 is made of silicon carbonitride, in a staircase structure formation that will be described later, a selectivity ratio with respect to the insulating layer 42 made of silicon oxide ($SiO_2$) can be used during processing of the insulating layer 42, the third layer 53 can be etched at an etching rate equivalent to that of the sacrificial layer 121 made of silicon nitride (SiN) during processing the sacrificial layer 121.

The third layer 53 is provided at least in the staircase regions SRa and SRb. In the present embodiment, the third layer 53 is provided over the array region AR and the pair of staircase regions SRa and SRb. When viewed from the Z direction (for example, when viewed from above), an X-direction end 53e of the third layer 53 is located between an X-direction end 41e1 of the third conductive layer 41-3 and an X-direction end 41e2 of the fourth conductive layer 41-4.

Action of Third Layer

Next, an action of the third layer 53 will be described.

Figure 8:
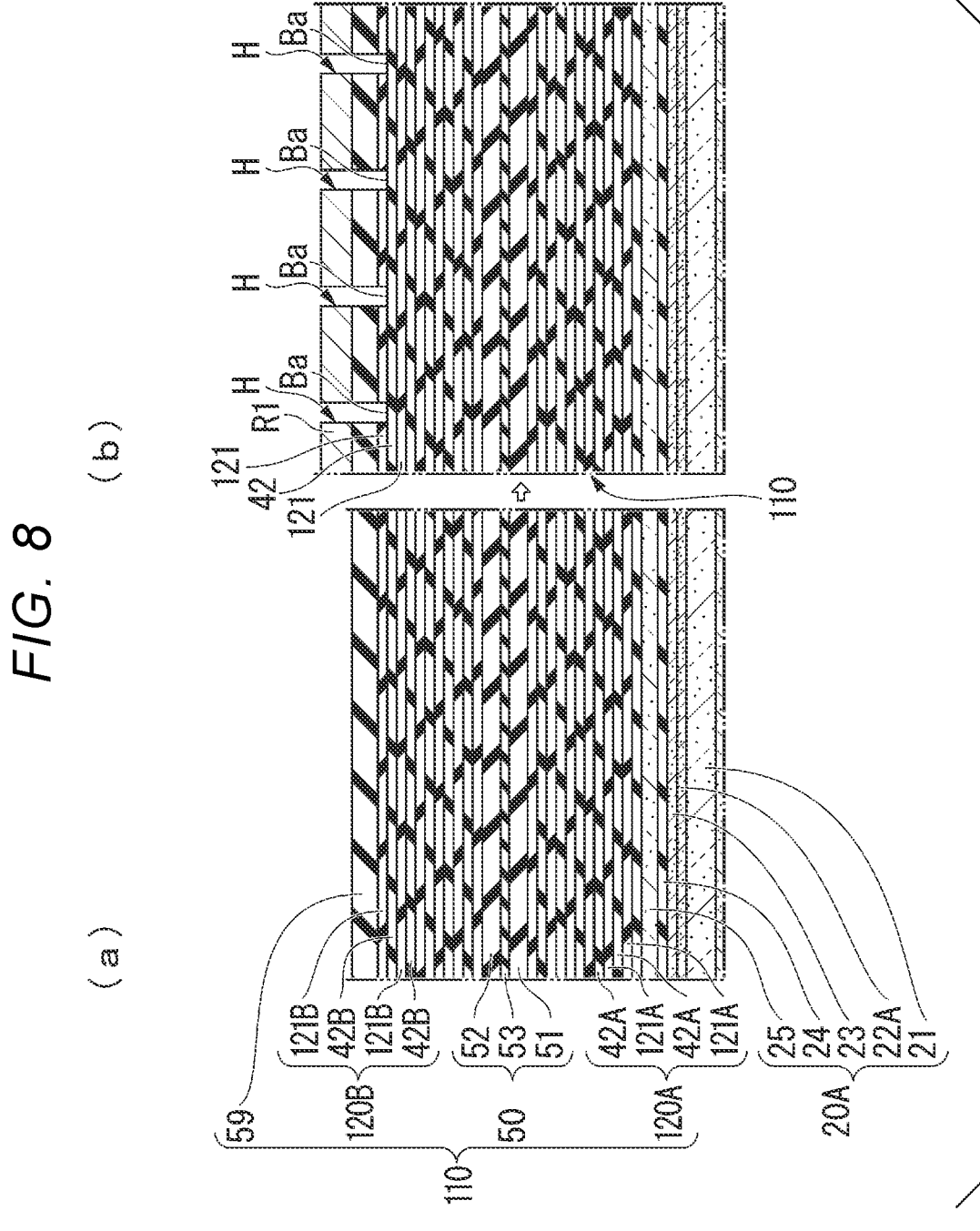
FIG. 8 is a sectional view showing a staircase region forming step according to the first embodiment.
Figure 9:
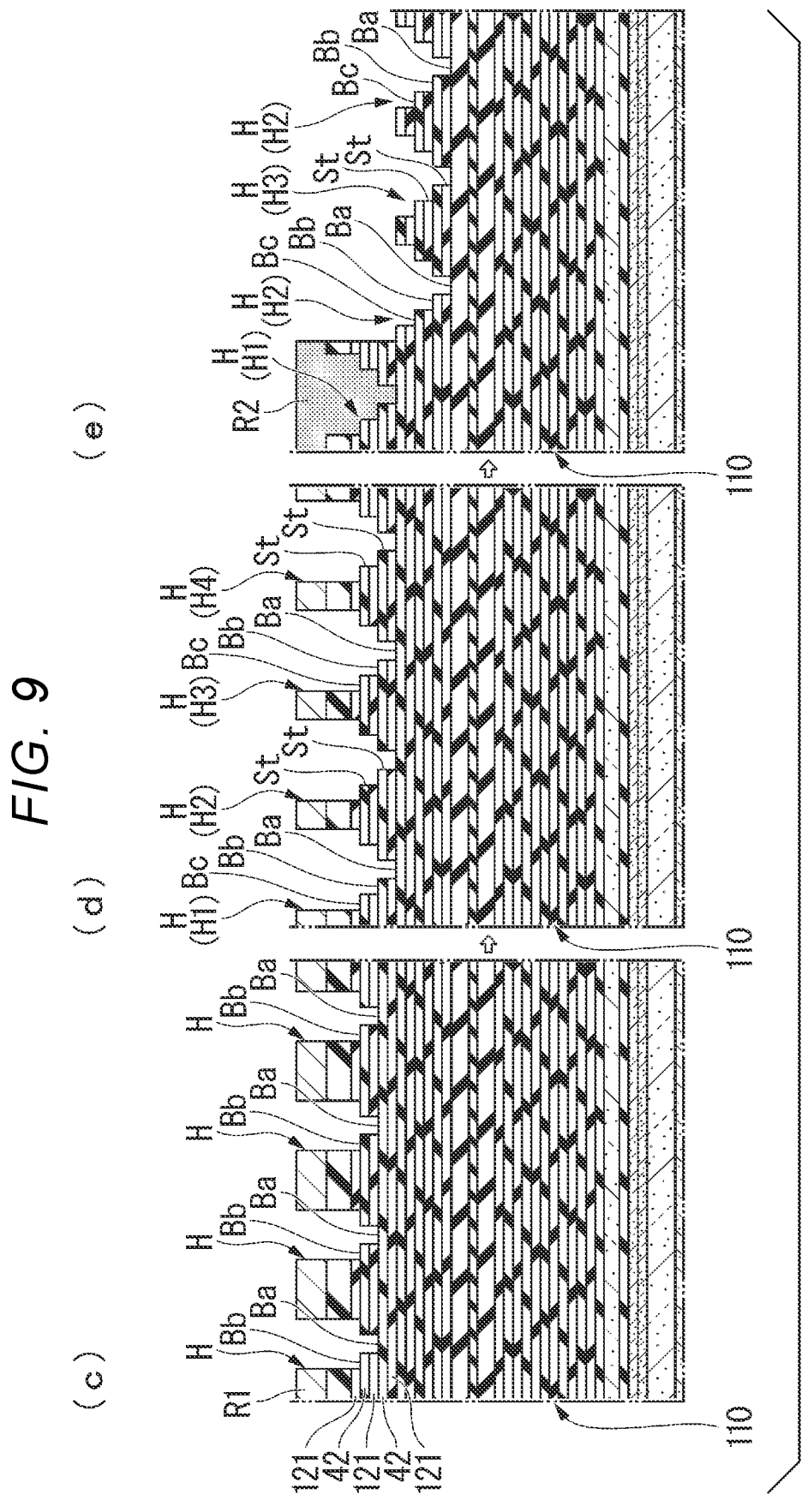
FIG. 9 is a sectional view showing the staircase region forming step according to the first embodiment.
Figure 10:
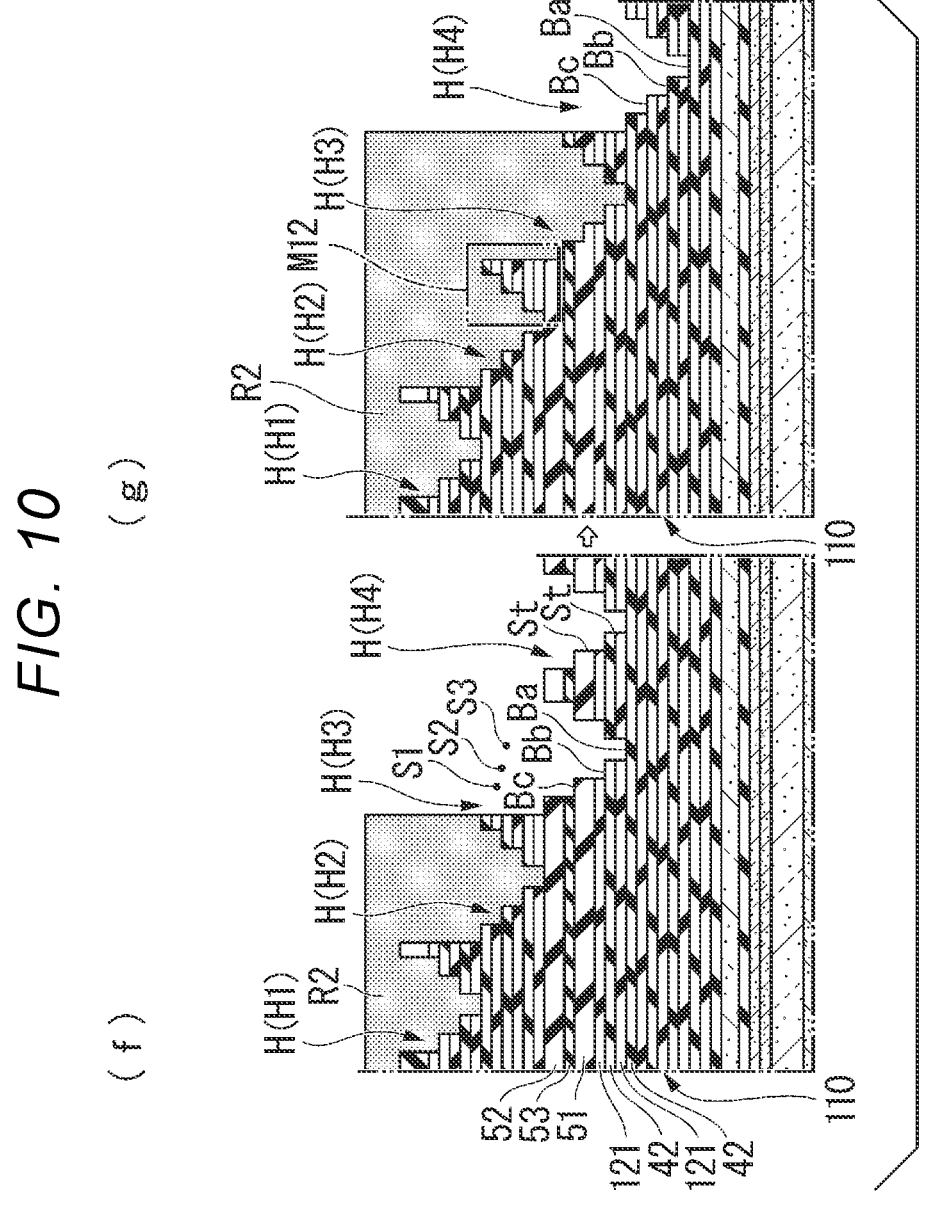
FIG. 10 is a sectional view showing the staircase region forming step according to the first embodiment.

FIGS. 8 to 10 are sectional views showing a step of forming the staircase regions Sa and Sb. In the present embodiment, processing of collectively forming two or more (for example, three or more) terrace portions 41t of the conductive layers 41 (hereinafter referred to as "staircase multistage processing") is performed. For example, FIGS. 8 to 10 show staircase multistage processing of collectively forming the terrace portions 41t of the three conductive layers 41.

First, a stacked body 110 is formed (refer to (a) in FIG. 8). The stacked body 110 includes a first stacked body 120A, an interposed portion 50, a second stacked body 120B, and an insulating layer 59. The first stacked body 120A is a stacked body from which the first stacked body 40A is formed. In the first stacked body 120A, a plurality of sacrificial layers 121A and a plurality of insulating layers 42A are alternately stacked one by one. The sacrificial layer 121A is a layer to be replaced with the conductive layer 41A in a replacement step (that will be described later) performed later. The sacrificial layer 121A is made of, for example, silicon nitride (SiN). The sacrificial layer 121A is an example of a "first film".

Similarly, the second stacked body 120B is a stacked body from which the second stacked body 40B is formed. The second stacked body 120B is disposed above the first stacked body 120A with the interposed portion 50 interposed therebetween. In the second stacked body 120B, a plurality of sacrificial layers 121B and a plurality of insulating layers 42B are alternately stacked one by one. The sacrificial layer 121B is a layer that will be replaced with the conductive layer 41B in the replacement step that will be performed later. The sacrificial layer 121B is made of silicon nitride (SiN), for example. The sacrificial layer 121B is an example of a "third film". Hereinafter, the sacrificial layer 121A and the sacrificial layer 121B will be simply referred to as "sacrificial layer 121" when not distinguished from each other.

The interposed portion 50 has a first layer 51, a second layer 52, and a third layer 53. The interposed portion 50 is disposed between the first stacked body 120A and the second stacked body 120B. The insulating layer 59 is provided on the top of the second stacked body 120B.

Next, a resist layer R1 is formed on the stacked body 110 and patterned to expose only a predetermined portion of the upper surface of the stacked body 110. Next, by performing anisotropic etching using the first etchant on the stacked body 110, only one layer of the sacrificial layer 121 is processed (refer to (b) in FIG. 8). Consequently, a plurality of depressions H each having a first bottom surface Ba are formed.

Here, in the anisotropic etching using the first etchant, it is possible to control a depth of the depression H with an interface between the sacrificial layer 121 and the insulating layer 42 as a target. Hereinafter, an example in which a depth of the depression H is controlled with the lower surface of the sacrificial layer 121 (that is, the upper surface of the insulating layer 42) as a target will be described below. Instead of this example, the depth of the depression H may be controlled with the upper surface of the sacrificial layer 121 (that is, the lower surface of the insulating layer 42) as a target.

Next, isotropic etching is performed on the resist layer R1 to slim the resist layer R1. The insulating layer 42 and the sacrificial layer 121 are further processed one by one by performing anisotropic etching using the first etchant on the stacked body 110 (refer to (c) in FIG. 9). Consequently, a plurality of depressions H each having a first bottom surface Ba and a second bottom surface Bb are formed.

Next, additional isotropic etching is performed on the resist layer R1 to slim the resist layer R1. The insulating layer 42 and the sacrificial layer 121 are further processed one by one by performing anisotropic etching using the first etchant on the stacked body 110 (refer to (d) in FIG. 9). Consequently, a plurality of depressions H each having a first bottom surface Ba, a second bottom surface Bb, and a third bottom surface Bc are formed.

Consequently, the plurality of depressions H for collectively processing the three conductive layers 41 are formed. The bottom of each depression H has one or more (for example, two or more) steps St and two or more bottom surfaces (for example, bottom surfaces Ba, Bb, and Bc) having different heights due to the steps St. The step St has a height corresponding to a total thickness of one insulating layer 42 and one sacrificial layer 121. In the example shown in FIG. 9, the bottom of the depression H has two steps St.

The plurality of depressions H provided in the stacked body 110 include, for example, a first depression H1, a second depression H2, a third depression H3, and a fourth depression H4. The second depression H2 is located farther than the first depression H1 when viewed from the array region AR. The third depression H3 is located farther than the second depression H2 when viewed from the array region AR. The fourth depression H4 is located farther than the third depression H3 when viewed from the array region AR.

Next, anisotropic etching using a first etchant is performed on the stacked body 110 while the inside of the first depression H1 is filled with a sacrificial body R2 serving as a mask. As a result, three insulating layers 42 and three sacrificial layers 121 are further processed for each of the second depression H2, the third depression H3, and the fourth depression H4 (refer to (e) in FIG. 9).

Next, anisotropic etching using the first etchant is performed on the stacked body 110 in a state in which the insides of the first depression H1 and the second depression H2 are filled with a sacrificial body R2 serving as a mask. As a result, three insulating layers 42 and three sacrificial layers 121 are processed for each of the third depression H3 and the fourth depression H4 (refer to (f) in FIG. 10). In the example shown in FIG. 10, the third depression H3 and the fourth depression H4 are deeply dug to penetrate through the interposed portion 50. Consequently, the third depression H3 and the fourth depression H4 reach the inside of the first stacked body 40A.

Next, anisotropic etching using the first etchant is performed on the stacked body 110 in a state in which the insides of the first depression H1, the second depression H2, and the third depression H3 are filled with a sacrificial body R2 serving as a mask, and thus the three insulating layers 42 and the three sacrificial layers 121 are further processed for the fourth depression H4 (refer to (g) in FIG. 10). By repeating such processing, staircase multistage processing in which the terrace portions 41t of the three conductive layers 41 are collectively formed is performed. As a result, the staircase regions SRa and SRb can be formed in a smaller number of steps than in a case where the conductive layers 41 are processed layer by layer.

Here, in the present embodiment, the third layer 53 is provided in the interposed portion 50. The third layer 53 has characteristics closer to the sacrificial layer 121 than the first layer 51 and the second layer 52 with respect to the first etchant. Therefore, the third layer 53 exhibits a behavior similar to that of the sacrificial layer 121 when the depression H reaching the interposed portion 50 is formed. Consequently, the third layer 53 serves as a stopper layer for one bottom surface of the depression H (for example, any of the first to third bottom surfaces Ba, Bb, and Bc), and thus it becomes easier to control a depth position of the bottom of the depression H. For example, in the example shown in (f) in FIG. 10, the presence of the third layer 53 improves the accuracy of a height position of the third bottom surface Bc of each of the depression H3 and the depression H4.

Consequently, it becomes easier to form the bottom of the depression H at a target depth position inside the interposed portion 50. As a result, even when a part of the depression H for performing staircase multistage processing is present in the interposed portion 50, pitches of the staircase-shaped steps formed over the first stacked body 40A, the second stacked body 40B, and the interposed portion 50 through the staircase multistage processing are likely to be uniform. Therefore, the staircase multistage processing can be continuously performed over the first stacked body 40A, the second stacked body 40B, and the interposed portion 50.

In the present embodiment, a space located above the third bottom surface Bc in the depression H is an example of a "first space portion S1". A space located above the second bottom surface Bb in the depression H is an example of a "second space portion S2". A space located above the first bottom surface Ba in the depression H is an example of a "third space portion S3". In the present embodiment, in certain staircase multistage processing, the first space portion S1 reaches the third layer 53 and a depth thereof is controlled by the third layer 53, the second space portion S2 reaches one sacrificial layer 121A and a depth thereof is controlled by the sacrificial layer 121A, and the third space portion S3 reaches another sacrificial layer 121A and a depth thereof is controlled by the sacrificial layer 121A (refer to (f) in FIG. 9).

5. Method of Manufacturing Semiconductor Memory Device

Next, a method of manufacturing the semiconductor memory device 1 will be described.

FIGS. 11 to 14 are sectional views showing the method of manufacturing the semiconductor memory device 1. Here, the lower structural body 20A in the middle of manufacturing has a sacrificial layer 22A instead of the second semiconductor layer 22. The sacrificial layer 22A is replaced with the second semiconductor layer 22 in a post-step, for example, according to a known method. Consequently, the lower structural body 20 is formed from the lower structural body 20A (refer to (i) in FIG. 13).

In the present embodiment, the first stacked body 120A is formed by alternately stacking the sacrificial layer 121A and the insulating layer 42A one by one on the lower structural body 20A. Next, the interposed portion 50 is formed by stacking the first layer 51, the third layer 53, and the second layer 52 in this order on the first stacked body 120A. Next, a first hole 131A and a second hole 132A are formed in the first stacked body 120A. The first hole 131A and the second hole 132A are holes extending in the Z direction through the interposed portion 50 and the first stacked body 120A (refer to (a) in FIG. 11). The first hole 131A is a hole through which the lower pillar 60A of the memory pillar 60 is formed. The second hole 132A is a hole for forming the lower portion of the support HR.

Figure 11:
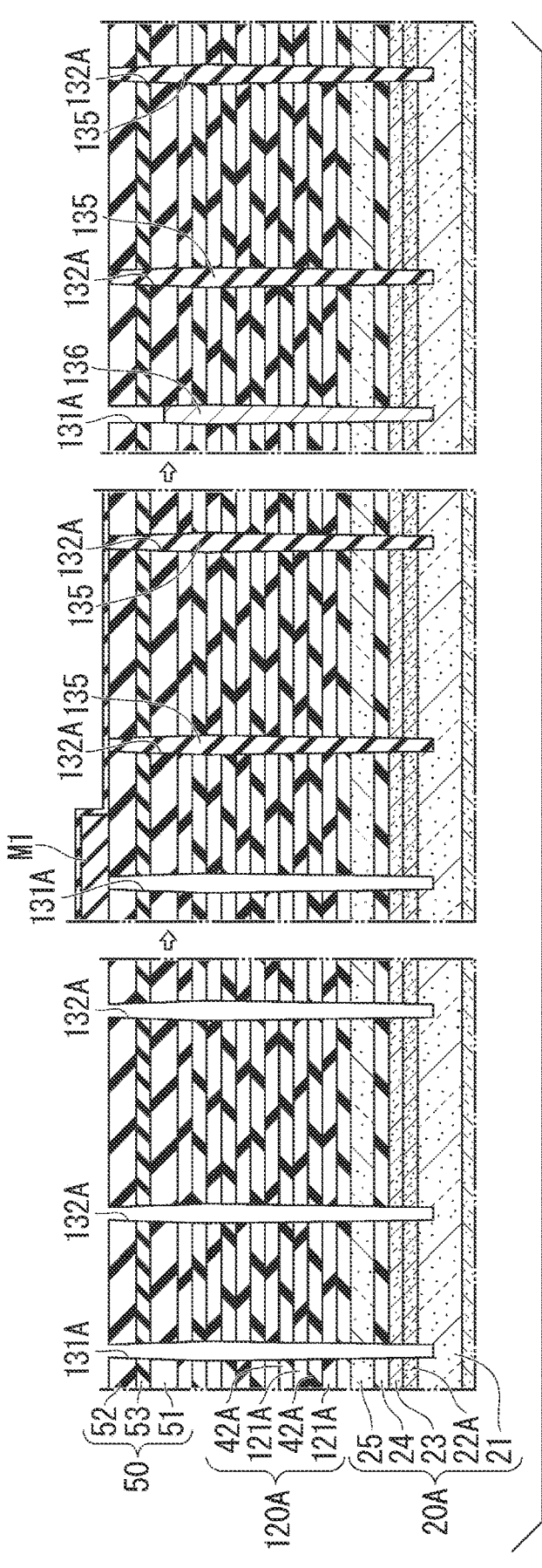
FIG. 11 is a sectional view showing the method of manufacturing the semiconductor memory device of the first embodiment.
Figure 12:
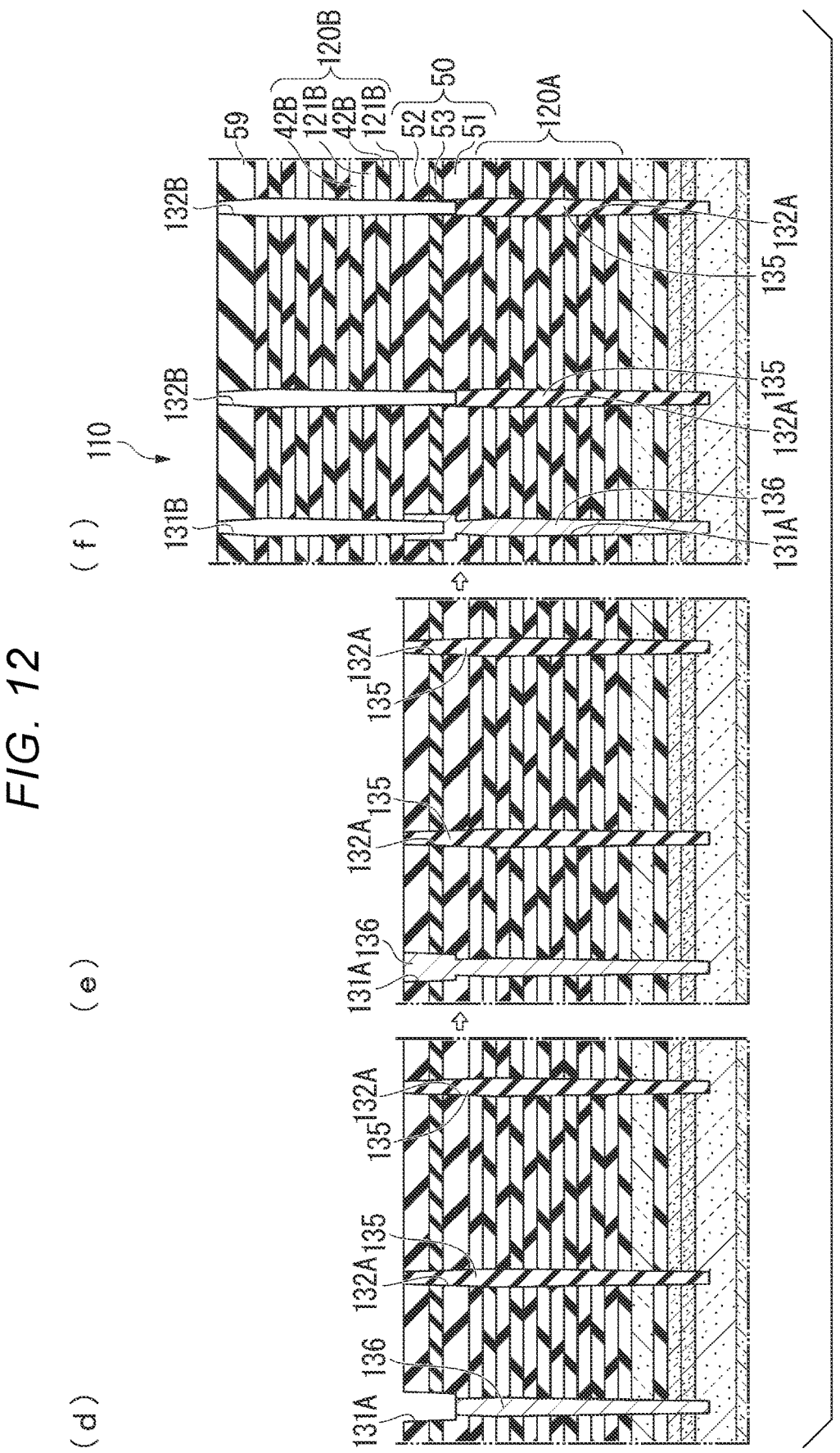
FIG. 12 is a sectional view showing the method of manufacturing the semiconductor memory device of the first embodiment.

Next, an insulating material such as silicon oxide is supplied in a state in which the first hole 131A is closed with a mask M1, and an insulator 135 filling the inside of the second hole 132A is formed (refer to (b) in FIG. 11). Next, the mask M1 is removed and a sacrificial material such as carbon is supplied to form a sacrificial body 136 filling the inside of the first hole 131A. Next, an upper portion of the sacrificial body 136 is removed through etching (refer to (c) in FIG. 11). Next, a diameter of the upper end of the first hole 131A is increased through etching (refer to (d) in FIG. 12).

Figure 15:
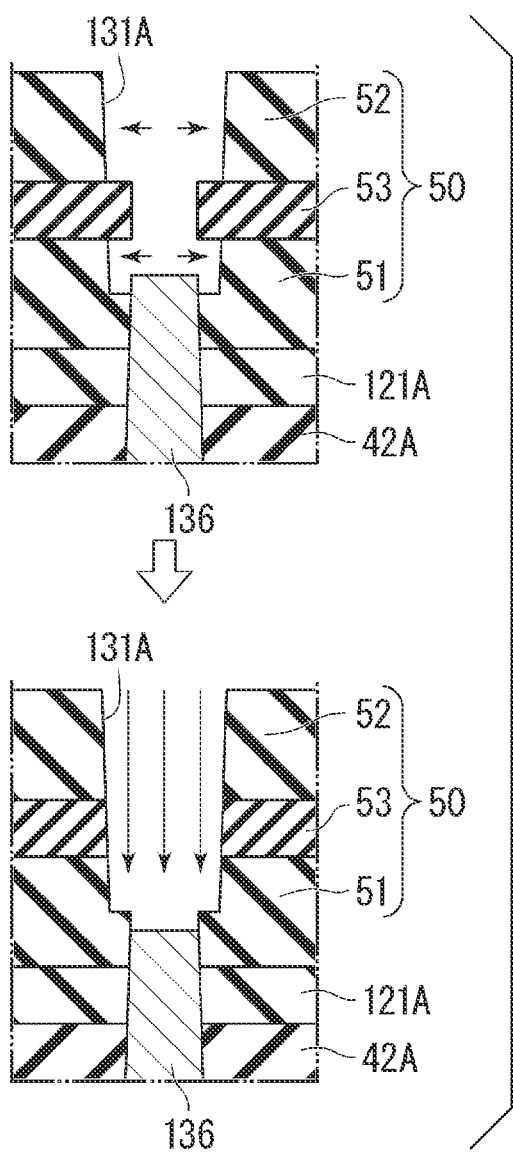
FIG. 15 is a sectional view showing the details of a step relating to a first hole of the first embodiment.

FIG. 15 is a diagram showing details of a step of increasing a diameter of the upper end of the first hole 131A. In the step of increasing a diameter of the upper end of the first hole 131A, first, the first layer 51 and the second layer 52 of the interposed portion 50 are removed through wet etching. As a result, the diameter of the upper end of the first hole 131A is increased except for the third layer 53. Next, by performing etch back based on reactive ion etching (RIE), unnecessary ends of the third layer 53 are removed. Consequently, the step of increasing the diameter of the upper end of the first hole 131A is completed.

Referring to FIG. 11 again, the remaining steps will be described. Next, a sacrificial material such as carbon is supplied to form a sacrificial body 136 that fills the upper end of the enlarged first hole 131A.

Next, the second stacked body 120B is formed by alternately stacking the sacrificial layer 121B and the insulating layer 42B on the interposed portion 50 one by one. Consequently, the stacked body 110 including the first stacked body 120A, the interposed portion 50, and the second stacked body 120B is formed. Next, a third hole 131B and a fourth hole 132B are formed in the second stacked body 120B. The third hole 131B and the fourth hole 132B are holes extending in the Z direction inside the second stacked body 40B. The third hole 131B is a hole for forming the upper pillar 60B of the memory pillar 60. The third hole 131B is connected to the first hole 131A. The fourth hole 132B is a hole for forming the upper portion of the support HR. The fourth hole 132B is connected to the second hole 132A (refer to (f) in FIG. 12).

Next, the sacrificial body 136 is removed from the first hole 131A, and the memory pillar 60 is formed inside the first hole 131A and the third hole 131B. By supplying an insulating material to the inside of the fourth hole 132B, the support HR extending over the second hole 132A and the fourth hole 132B is formed. It should be noted that in the following drawings, the support HR is indicated by a dashed line for ease of viewing the drawings.

Next, the ends of the plurality of sacrificial layers 121 are processed in a staircase shape through the staircase multistage processing described above with reference to FIGS. 8 to 10 (refer to (g) in FIG. 13). Next, an insulating material is supplied to the staircase regions SRa and SRb to form the insulating portion 141 that fills the ends of the plurality of sacrificial layers 121 (refer to (h) in FIG. 13).

Next, a slit SLT (refer to FIG. 20) for forming the dividing portion 70 is formed in the stacked body 30, and the sacrificial layer 121 is removed by performing etching (etching using the second etchant) through the slit SLT (refer to (i) in FIG. 13). In this case, the third layer 53 is not removed by the second etchant and remains as a part of the interposed portion 50. Next, a conductive material is supplied to the space from which the sacrificial layer 121 is removed to form the conductive layer 41. Thus, a replacement step is performed in which the plurality of sacrificial layers 121 are replaced with the plurality of conductive layers 41 (refer to (j) in FIG. 14). Consequently, the stacked body 30 is formed.

Figure 14:
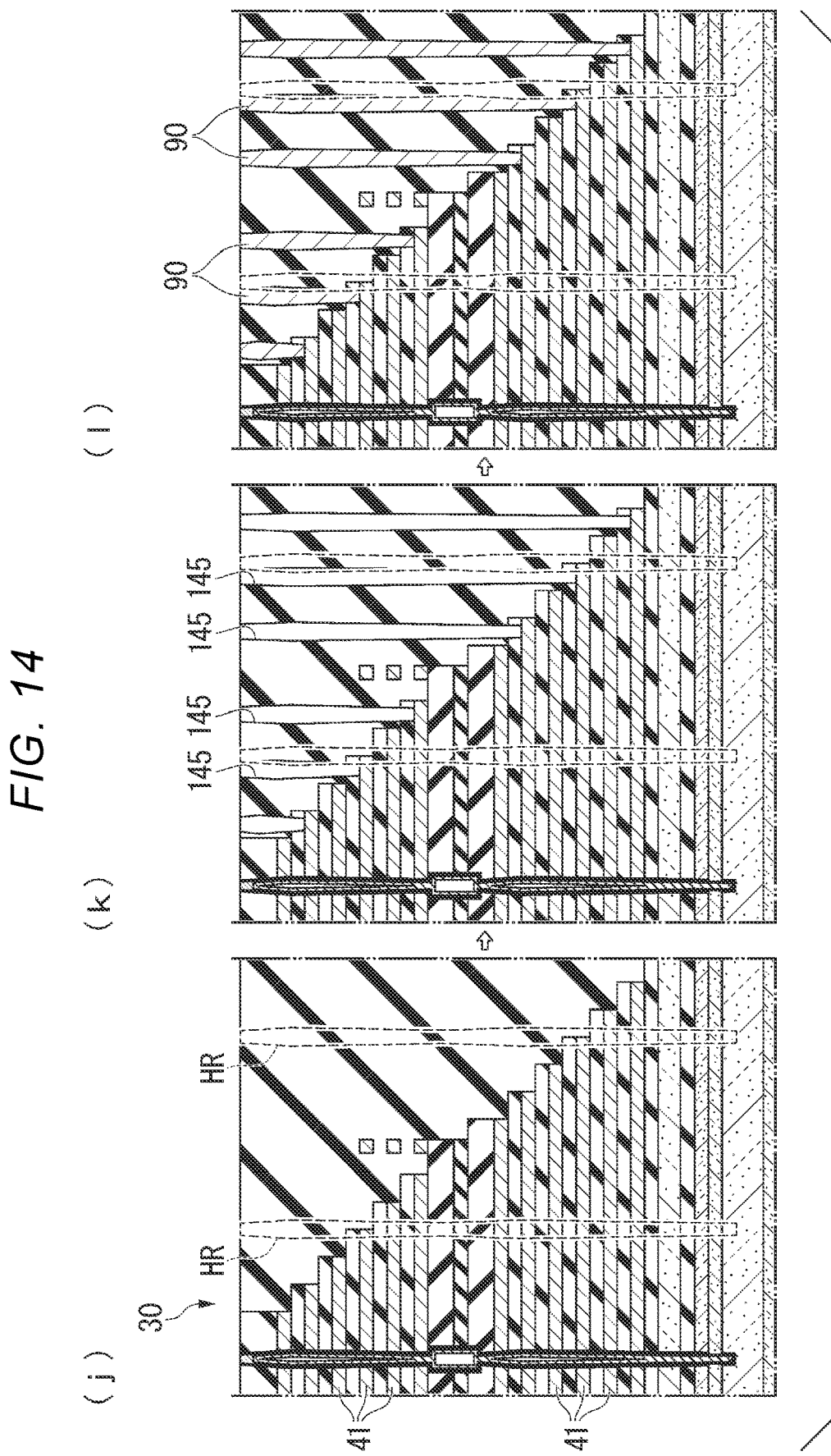
FIG. 14 is a sectional view showing the method of manufacturing the semiconductor memory device of the first embodiment.

Next, a plurality of holes 145 for providing a plurality of contacts 90 are provided in the stacked body 30 (refer to (k) in FIG. 14). Next, a conductive material is supplied inside the plurality of holes 145 to form a plurality of contacts 90 (refer to (l) in FIG. 14). Thereafter, the upper wiring portion 100 and the like are formed, and the semiconductor memory device 1 is completed.

6. Advantages

In order to increase the density of a semiconductor memory device, it is effective to increase the number of layers of stacked bodies including memory cell transistors MT. In order to achieve this, a high aspect ratio hole (HARH) etching technique for processing stacked bodies of which the number of layers is increased in the Z direction is required. However, the HARH etching has problems that (1) an etching rate at the bottom of a hole decreases (due to the decrease in an amount of ions to be supplied) due to the increase in an aspect ratio, that is, a throughput decreases, (2) a maximum hole diameter increases due to the attack of obliquely incident ions, and the like.

As a method of increasing the number of layers of a stacked body without increasing the aspect of HARH etching, a stacked body is divided into a plurality of pieces in the Z direction, and a combination of forming a stacked body with a small number of layers and HARH etching is repeated (hereinafter referred to as (referred to as "multi-tiering") makes it possible to increase the number of layers of stacked bodies. However, in this case, an increase in the number of steps is problematic. In order to reduce the number of steps, staircase multistage processing for collectively forming a plurality of steps in a staircase portion is effective.

However, in a case of providing multi-tiering, an interposed portion for providing a connection portion for connecting columnar bodies of the multistage configuration of the memory pillar is present in divided portions of a stacked body. Thus, a pitch between the conductive layers 41 and the insulating layers 42 in the stacked body is disrupted (unequal pitches exist) at the divided portions of the stacked body. As a result, when performing the above staircase multistage processing, deviations in the staircase multistage processing may occur in the divided portions of the stacked body, and processing defects due to over-etching may occur. Therefore, it is difficult to improve the manufacturability of a semiconductor memory device.

On the other hand, in the present embodiment, the semiconductor memory device 1 has the interposed portion 50 disposed between the first stacked body 40A and the second stacked body 40B. At least a part of the interposed portion 50 includes the first layer 51 containing a first insulating material, the second layer 51 disposed between the first layer 51 and the second stacked body 40B in the Z direction and containing the first insulating material 52, and the third layer 53 disposed between the first layer 51 and the second layer 52 in the Z-direction and containing a first material different from the first insulating material. With such a configuration, similar to the sacrificial layer 121 in the stacked body 30, the third layer 53 serves as a stopper layer, and thus it becomes easier to control a depth position of the bottom of the depression H. Thus, it is possible to prevent the occurrence of processing defects due to over-etching. Consequently, the manufacturability of the semiconductor memory device 1 can be improved.

In the present embodiment, the first material is a second insulating material different from the first insulating material. With such a configuration, it is possible to reduce electrical influence of the third layer 53 on the memory pillar 60 or the conductive layer 41. Consequently, it becomes easier to provide the semiconductor memory device 1 that is also excellent in electrical characteristics.

In the present embodiment, the second insulating material has characteristics closer to silicon nitride than the first insulating material with respect to the first etchant, and has characteristics closer to the first insulating material than silicon nitride with respect to the second etchant different from the first etchant. With such a configuration, the third layer 53 can play the same role as the sacrificial layer 121 in the stacked body 110 when processing the staircase portion, and the third layer 53 can remain without being replaced with a conductive material in the replacement step in which the sacrificial layer 121 is replaced with the conductive layer 41. Consequently, it becomes easier to provide the semiconductor memory device 1 having excellent electrical characteristics as described above.

Second Embodiment

Next, a second embodiment will be described. The second embodiment is different from the first embodiment in that the third layer 53 is provided only in the staircase regions SRa and SRb. Configurations other than those described below are the same as those of the first embodiment. In the drawings of the present embodiment, for convenience of description, the dividing portion 70 is illustrated in a sectional view along the X direction.

Figure 16:
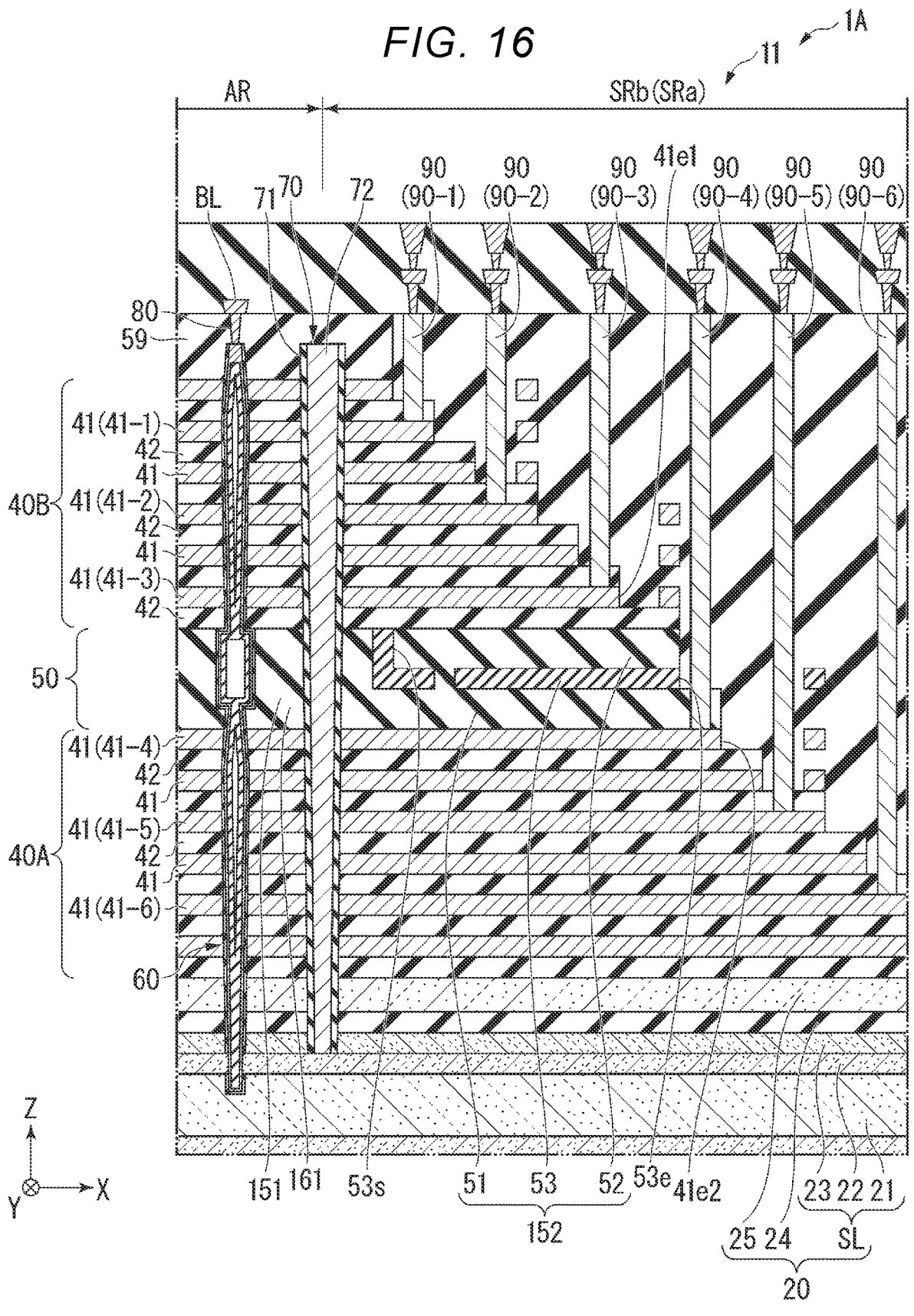
FIG. 16 is a sectional view showing a part of a semiconductor memory device according to a second embodiment.
Figure 17:
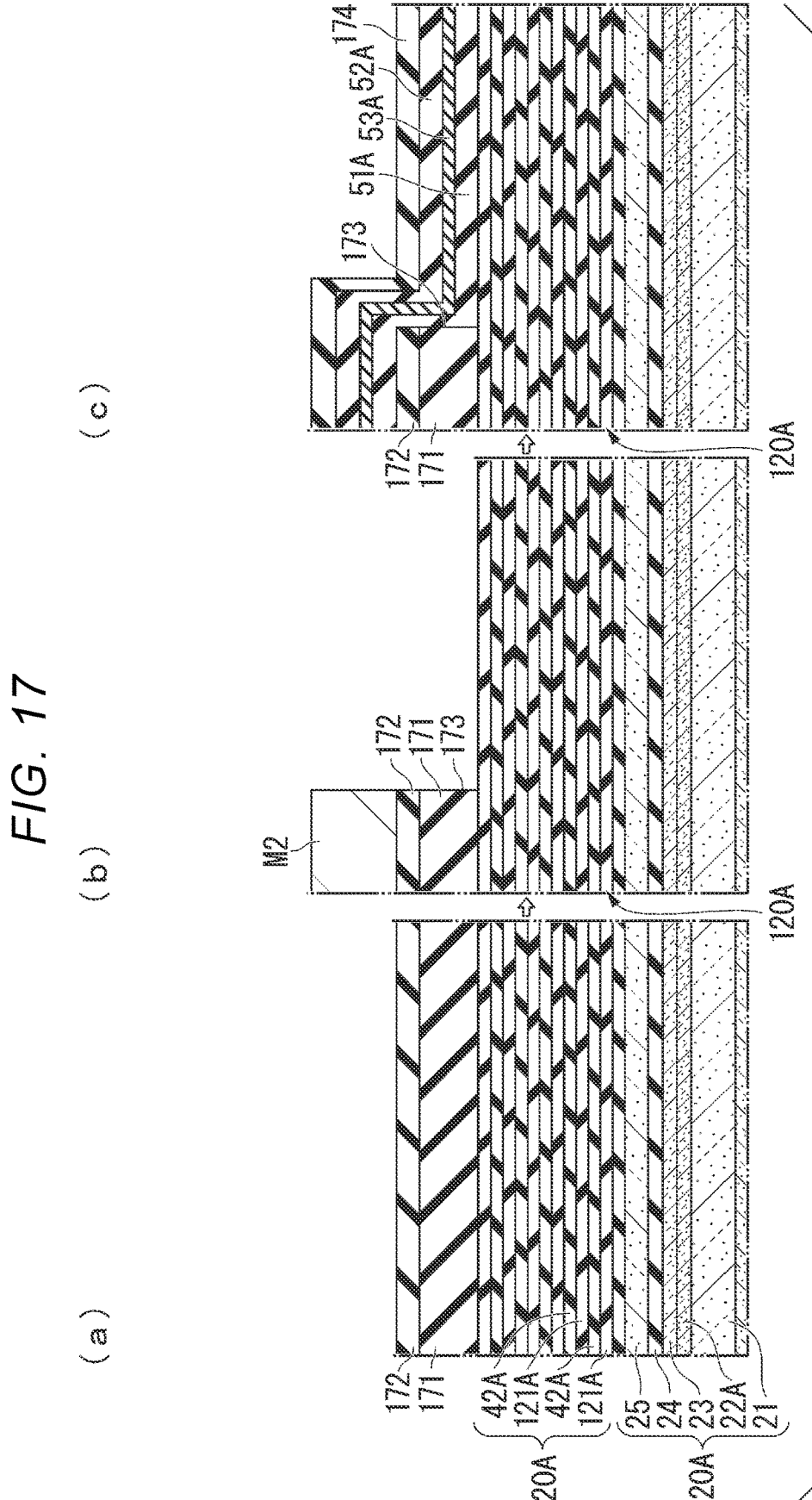
FIG. 17 is a sectional view showing a method of manufacturing the semiconductor memory device according to the second embodiment.
Figure 18:
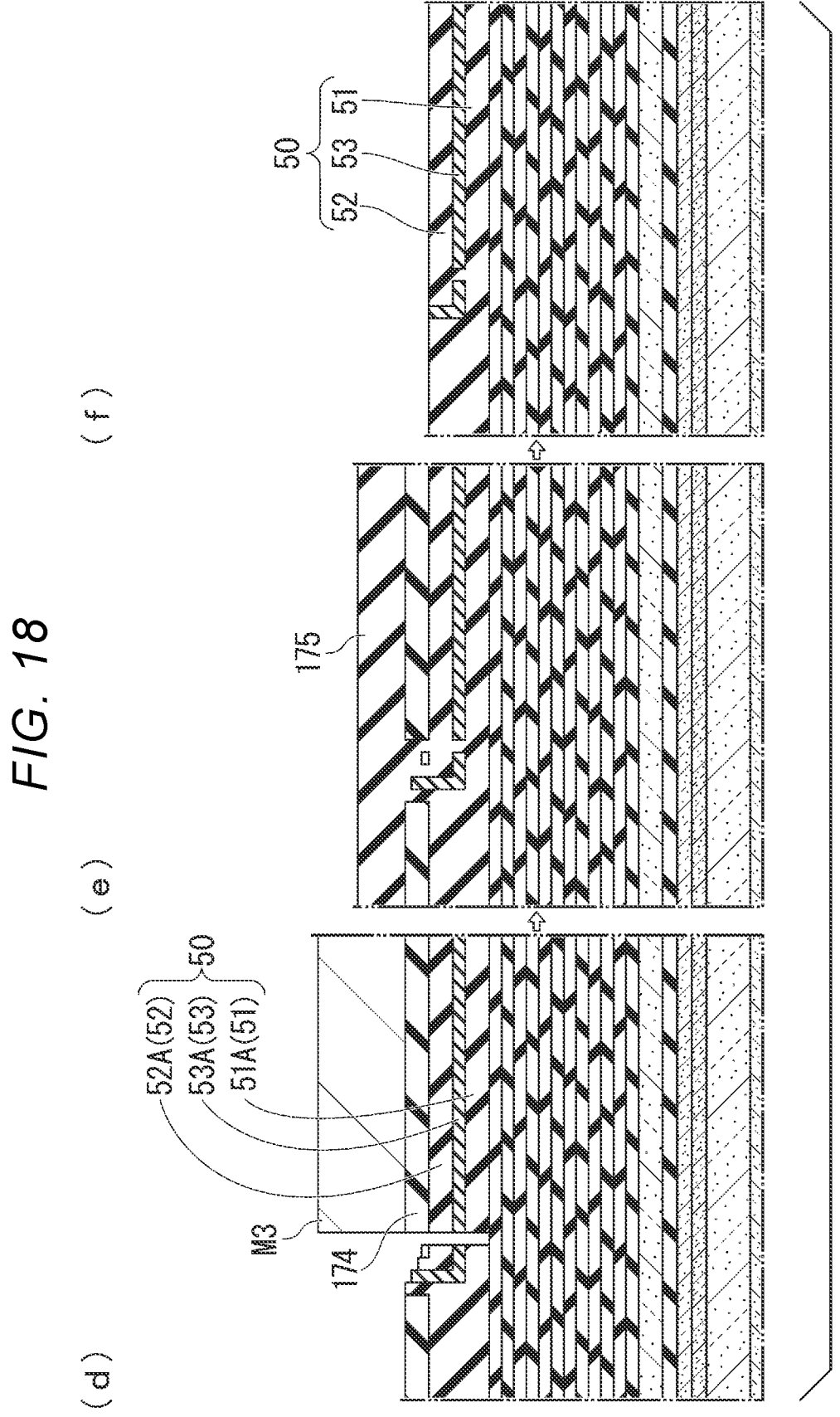
FIG. 18 is a sectional view showing the method of manufacturing the semiconductor memory device according to the second embodiment.
Figure 19:
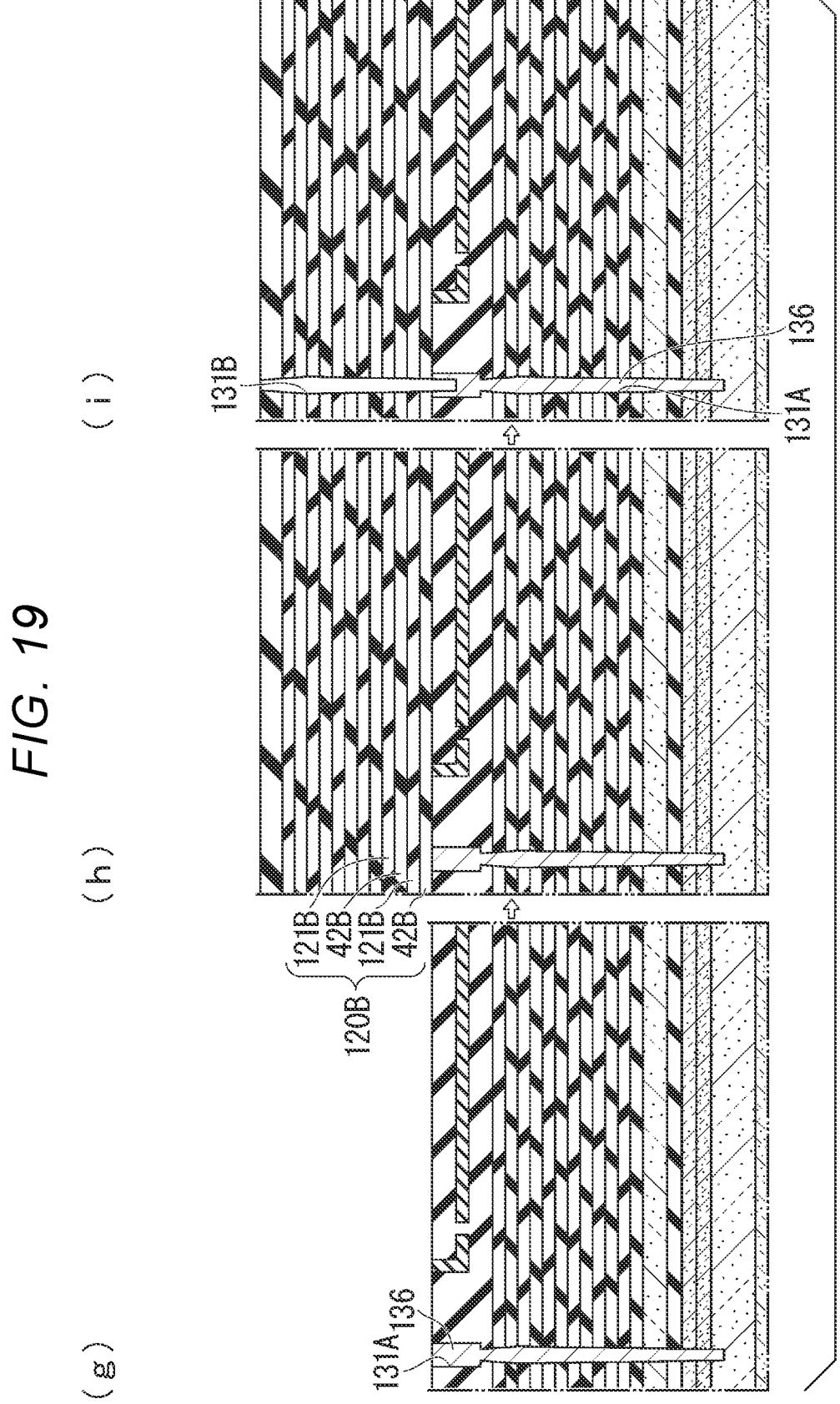
FIG. 19 is a sectional view showing the method of manufacturing the semiconductor memory device according to the second embodiment.

FIG. 16 is a sectional view showing a part of a semiconductor memory device 1A of the second embodiment. In the present embodiment, the interposed portion 50 has a first portion 151 and a second portion 152.

The first portion 151 is a portion of the interposed portion 50 that is provided in the array region AR. The first portion 151 is formed of one insulating layer 161. The insulating layer 161 is disposed between a first stacked body 40A and a second stacked body 40B in the Z direction. The insulating layer 161 extends in the X and Y directions. The insulating layer 161 is made of the first insulating material.

The second portion 152 is a portion of the interposed portion 50 in the staircase regions SRa and SRb. The second portion 152 includes a first layer 51, a second layer 52, and a third layer 53. That is, in the present embodiment, the third layer 53 is provided only in the staircase regions SRa and SRb, and is not provided in the array region AR. In the present embodiment, the third layer 53 has an upright portion 53s that stands upward at the end of the third layer 53 on the side of the array region AR.

Next, a method of manufacturing the semiconductor memory device 1A will be described.

FIGS. 17 to 21 are sectional views showing the method of manufacturing the semiconductor memory device 1A. First, the sacrificial layer 121A and the insulating layer 42A are alternately stacked one by one on the lower structural body 20 to form the first stacked body 120A. Next, an insulating layer 171 and an insulating layer 172 are sequentially formed on the first stacked body 120A (refer to (a) in FIG. 17). The insulating layer 171 and the insulating layer 172 are provided over the array region AR and the staircase regions SRa and SRb.

Next, in a state in which a mask M2 is provided on the array region AR, the insulating layers 171 and 172 are removed in the staircase regions SRa and SRb. As a result, a step 173 is formed in the first stacked body 40A (refer to (b) in FIG. 17). Next, a first layer 51A, a third layer 53A, a second layer 52A, and an insulating layer 174 are sequentially formed on the first stacked body 120A in which the step 173 is formed (refer to (c) in FIG. 17).).

Next, the first layer 51A, the third layer 53A, the second layer 52A, and the insulating layer 174 provided in the array region AR are removed in a state in which a mask M3 is provided in the staircase regions SRa and SRb. As a result, the first layer 51A, the third layer 53A, and the second layer 52A remain only in the staircase regions SRa and SRb, and become the first layer 51, the third layer 53, and the second layer 52 (refer to (d) in FIG. 18). Next, an insulating material is supplied to form an insulating portion 175 that fills an unnecessary depression or the like (refer to (e) in FIG. 18). Next, unnecessary portions of the insulating portion 175 are removed (refer to (f) in FIG. 18). Thereafter, steps in FIGS. 19 to 21 corresponding to the steps in FIGS. 12 to 14 of the first embodiment are performed. Thus, the semiconductor memory device 1A is manufactured.

With such a configuration, it is possible to improve the manufacturability of the semiconductor memory device 1A in the same manner as in the first embodiment. In the present embodiment, the interposed portion 50 includes the first portion 151 located in the array region AR and the second portions 152 located in the staircase regions SRa and SRb. The second portion 152 has the first layer 51, the second layer 52, and the third layer 53. The first portion 151 is made of the first insulating material. With such a configuration, since the third layer 53 is not present in the array region AR, the influence of the third layer 53 can be reduced in the step of increasing a diameter of the upper end of the first hole 131A for providing the memory pillar 60 ((d) in FIG. 12 and FIG. 15). Processing for increasing a diameter of the upper end of the first hole 131A can be easily performed.

Third Embodiment

Next, a third embodiment will be described. The third embodiment is different from the second embodiment in that the third layer 53 is made of a conductive material. Configurations other than those described below are the same as those of the second embodiment.

Figure 23:
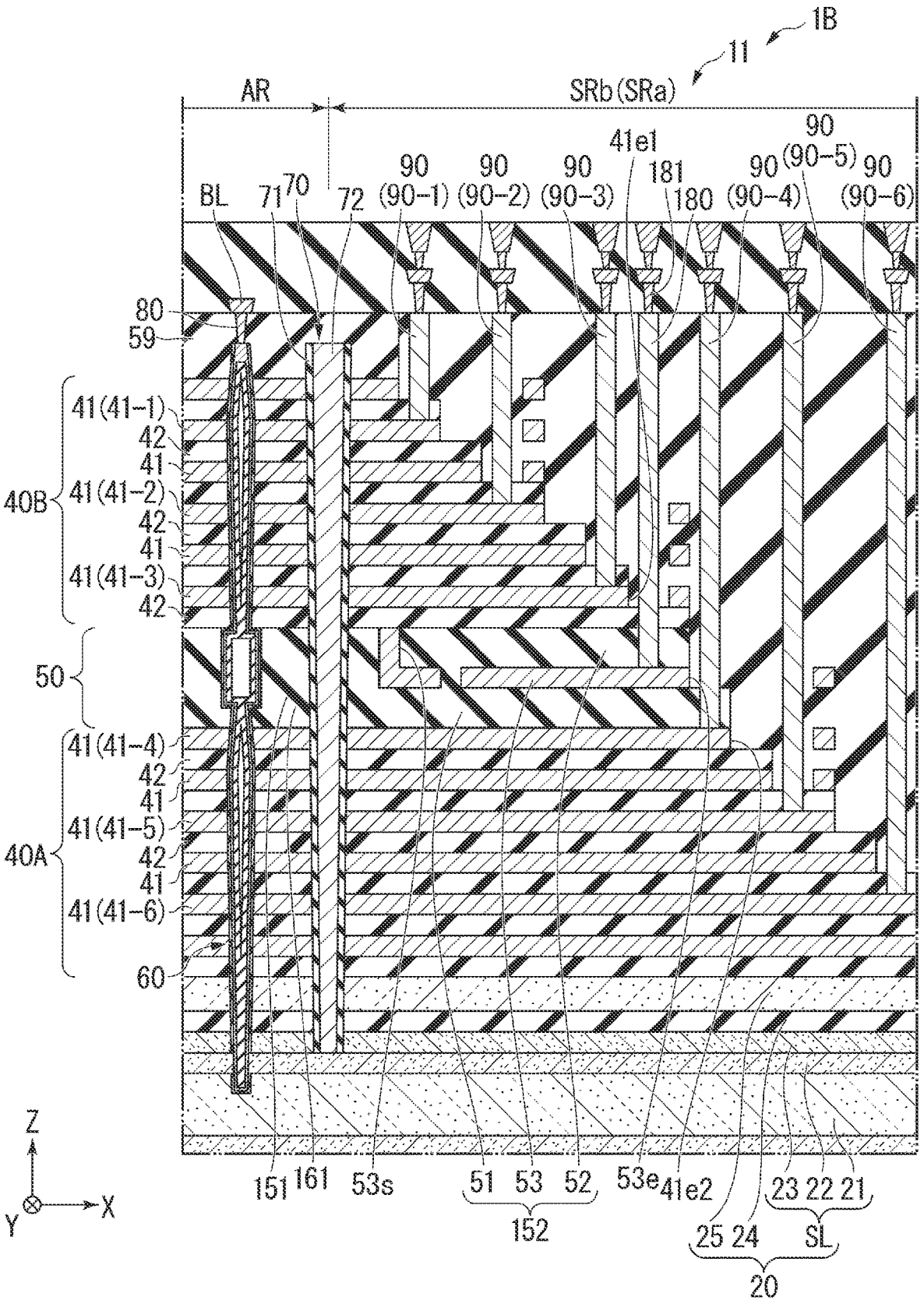
FIG. 23 is a sectional view showing a part of a semiconductor memory device according to a third embodiment.

FIG. 23 is a sectional view showing a part of a semiconductor memory device 1B of the third embodiment. In the present embodiment, the third layer 53 is provided only in the staircase regions SRa and SRb in the same manner as in the second embodiment. In the present embodiment, the third layer 53 is made of a metal material. The metal material is, for example, the same as the metal material contained in the conductive layer 41. A metal material forming the third layer 53 is, for example, tungsten or molybdenum.

In the present embodiment, the memory cell array 11 has a contact 180. The contact 180 extends in the Z direction and is connected to the third layer 53. The contact 180 is electrically connected to the ground of semiconductor memory device 1B via a contact 181 provided above the contact 180. As a result, the third layer 53 has the ground potential.

Next, a method of manufacturing the semiconductor memory device 1B will be described.

Figure 24:
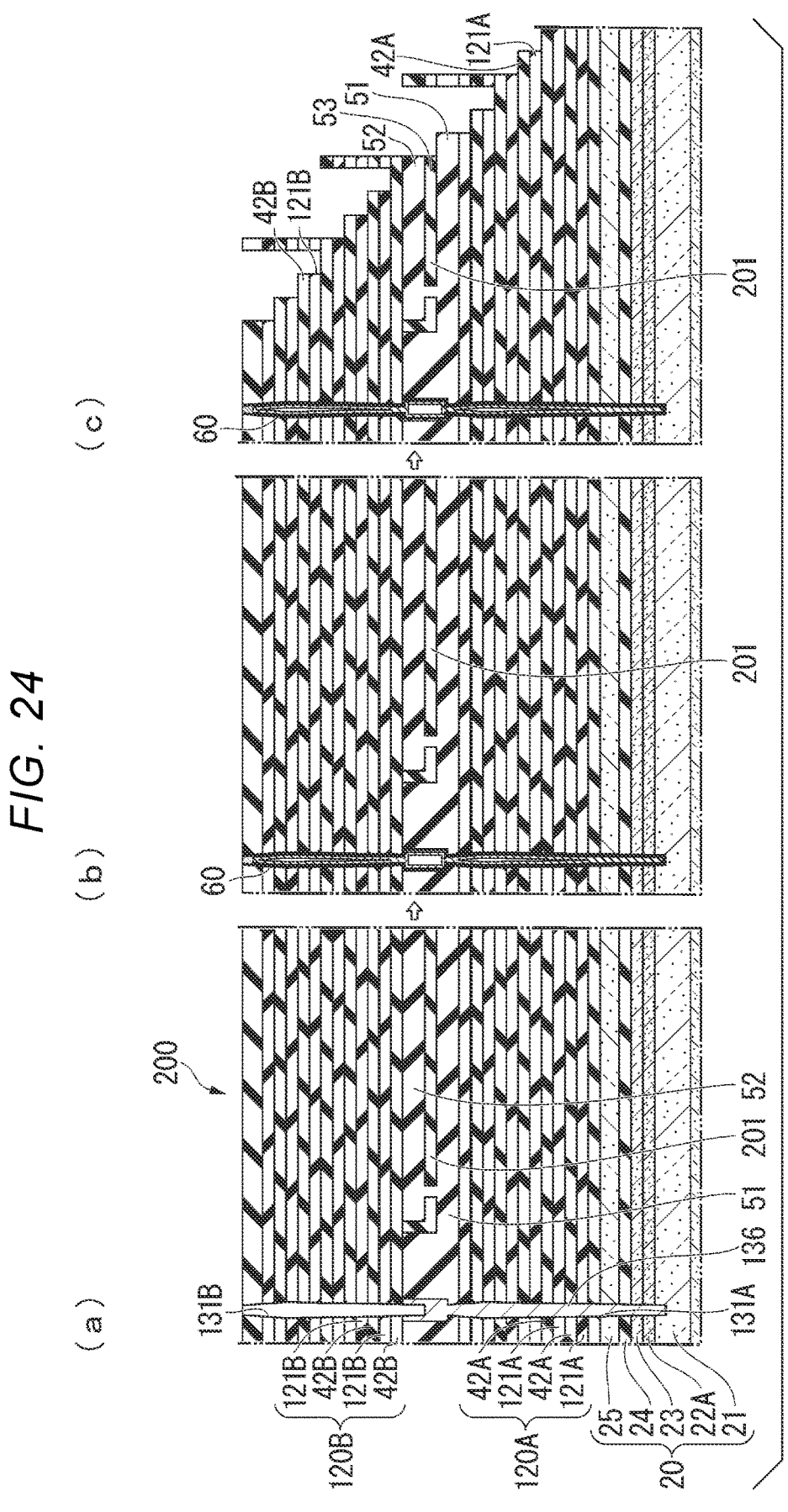
FIG. 24 is a sectional view showing a method of manufacturing a semiconductor memory device according to the third embodiment.
Figure 25:
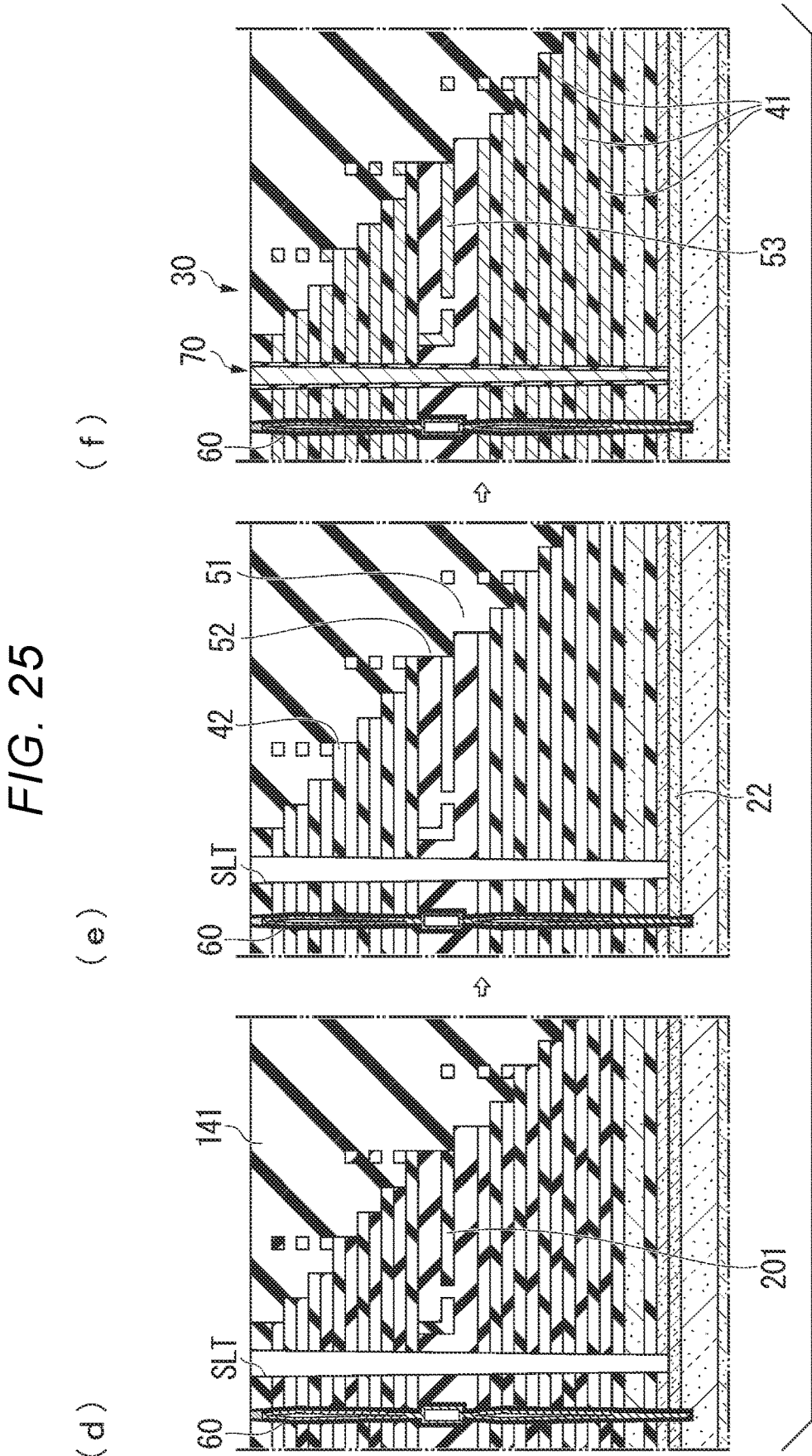
FIG. 25 is a sectional view showing the method of manufacturing a semiconductor memory device according to the third embodiment.
Figure 26:
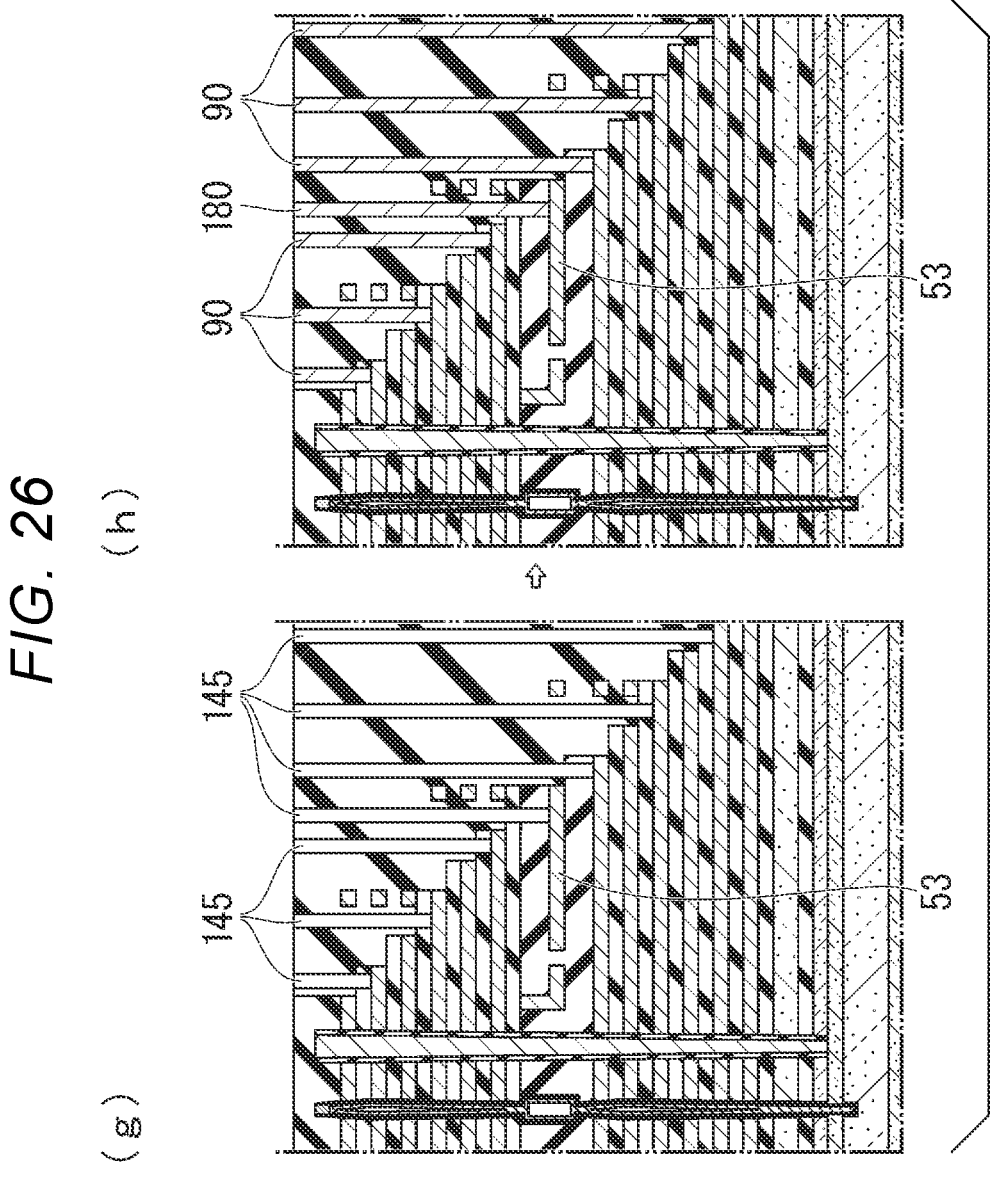
FIG. 26 is a sectional view showing the method of manufacturing a semiconductor memory device according to the third embodiment.

FIGS. 24 to 26 are diagrams showing a method of manufacturing the semiconductor memory device 1B. In the present embodiment, a stacked body 200 is formed in the same steps as (a) in FIG. 17 to (i) in FIG. 19 in the second embodiment (refer to (a) in FIG. 24). However, in the present embodiment, the stacked body 300 includes a sacrificial layer 201 instead of the third layer 53 made of silicon carbonitride (SiCN). The sacrificial layer 201 is made of silicon nitride (SiN) that is the same material as that of the sacrificial layer 121.

Figure 20:
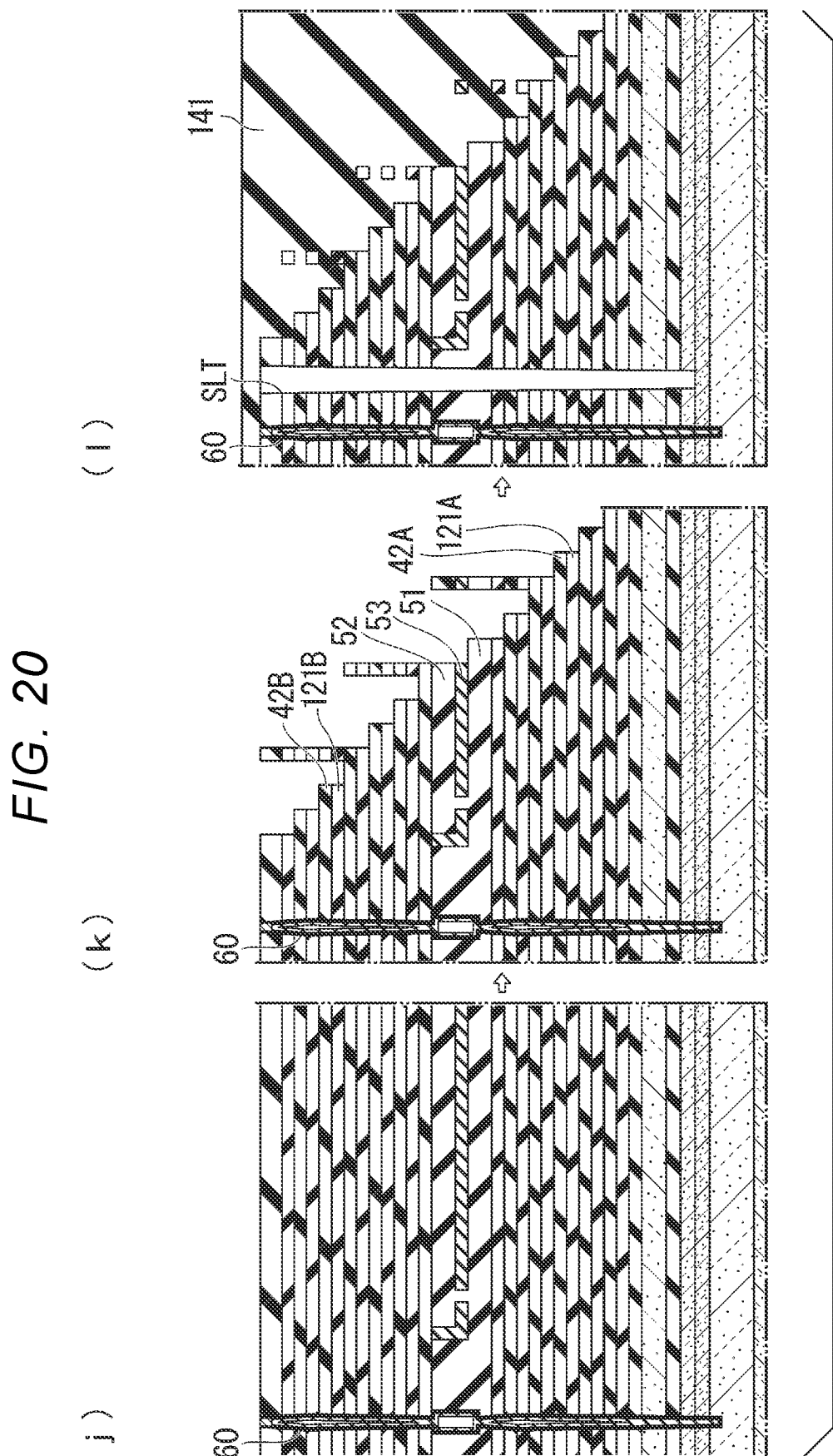
FIG. 20 is a sectional view showing the method of manufacturing the semiconductor memory device according to the second embodiment.
Figure 21:
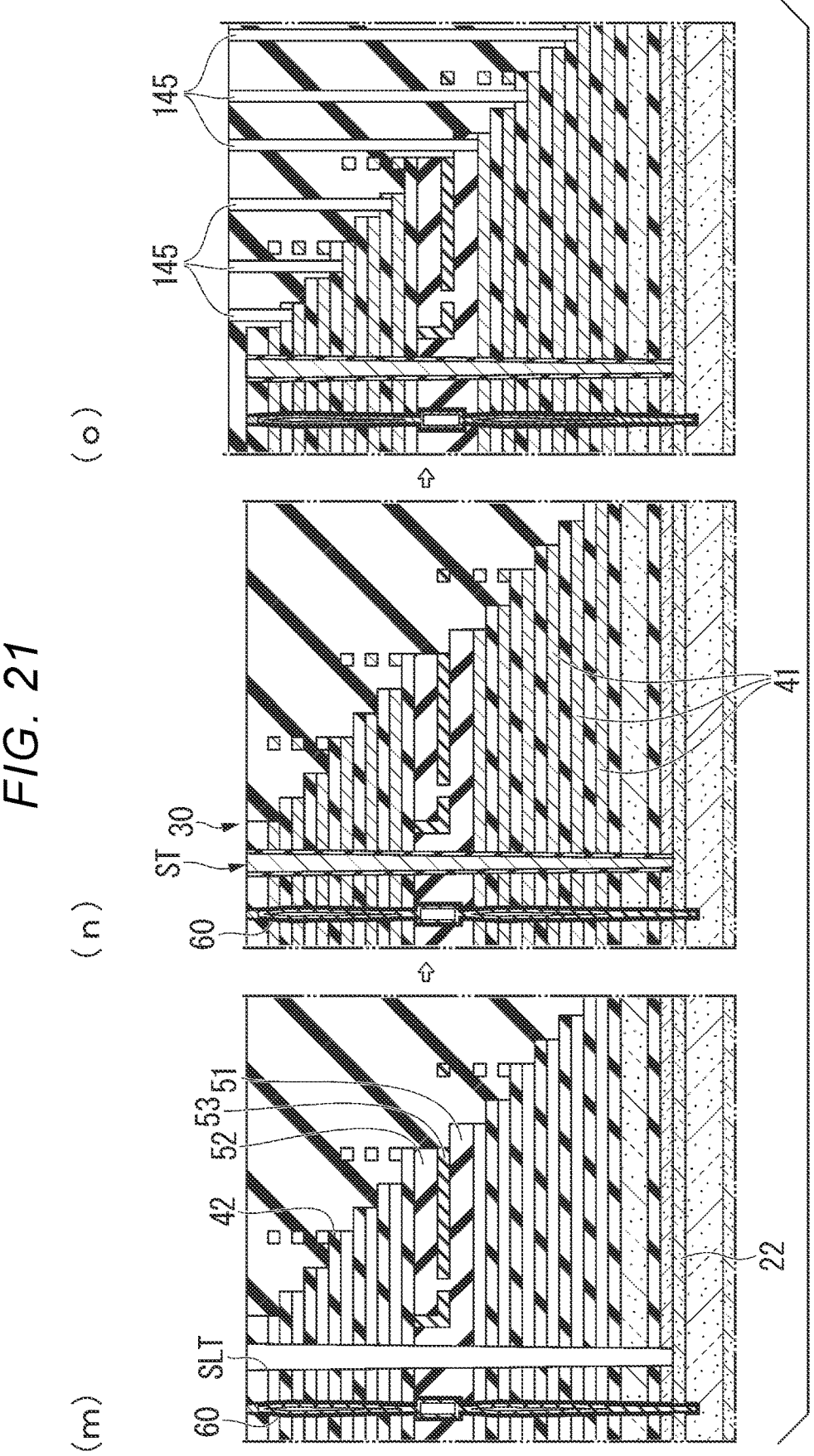
FIG. 21 is a sectional view showing the method of manufacturing the semiconductor memory device according to the second embodiment.

Thereafter, steps of (b) in FIG. 24, (c) in FIG. 24, and (d) in FIG. 25 corresponding to the steps of (j) in FIG. 20, (k) in FIG. 20, and (l) in FIG. 21 are performed. In the present embodiment, the sacrificial layer 201 is removed together with the sacrificial layer 121 in the replacement step described above (refer to (e) in FIG. 25). A conductive material (for example, a metal material such as tungsten) is supplied to a space from which the sacrificial layer 121 and the sacrificial layer 201 are removed, and thus the conductive layer 41 and the third layer 53 are formed (refer to (f) in FIG. 25).

Figure 22:
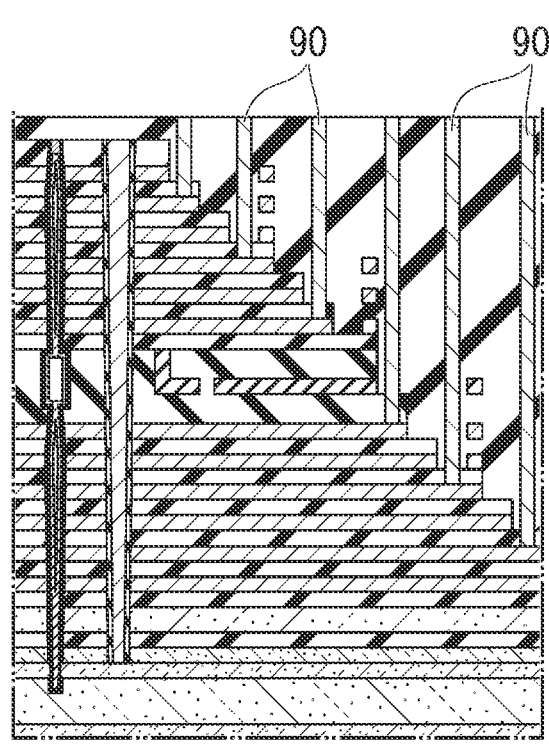
FIG. 22 is a sectional view showing the method of manufacturing the semiconductor memory device according to the second embodiment.

Thereafter, steps in (g) in FIG. 26 and (h) in FIG. 26 corresponding to the steps in (o) in FIG. 21 and (p) in FIG. 22 of the second embodiment are performed. Thus, the semiconductor memory device 1B is manufactured.

With such a configuration, since the stacked body 200 can be formed by using the sacrificial layer 201 made of the same material as that of the sacrificial layer 121, the manufacturability can be improved in some cases.

Fourth Embodiment

Next, a fourth embodiment will be described. The fourth embodiment is different from the first embodiment in that the memory cell array 11 has a contact region CR instead of the staircase regions SRa and SRb. Configurations other than those described below are the same as those of the first embodiment.

Figure 27:
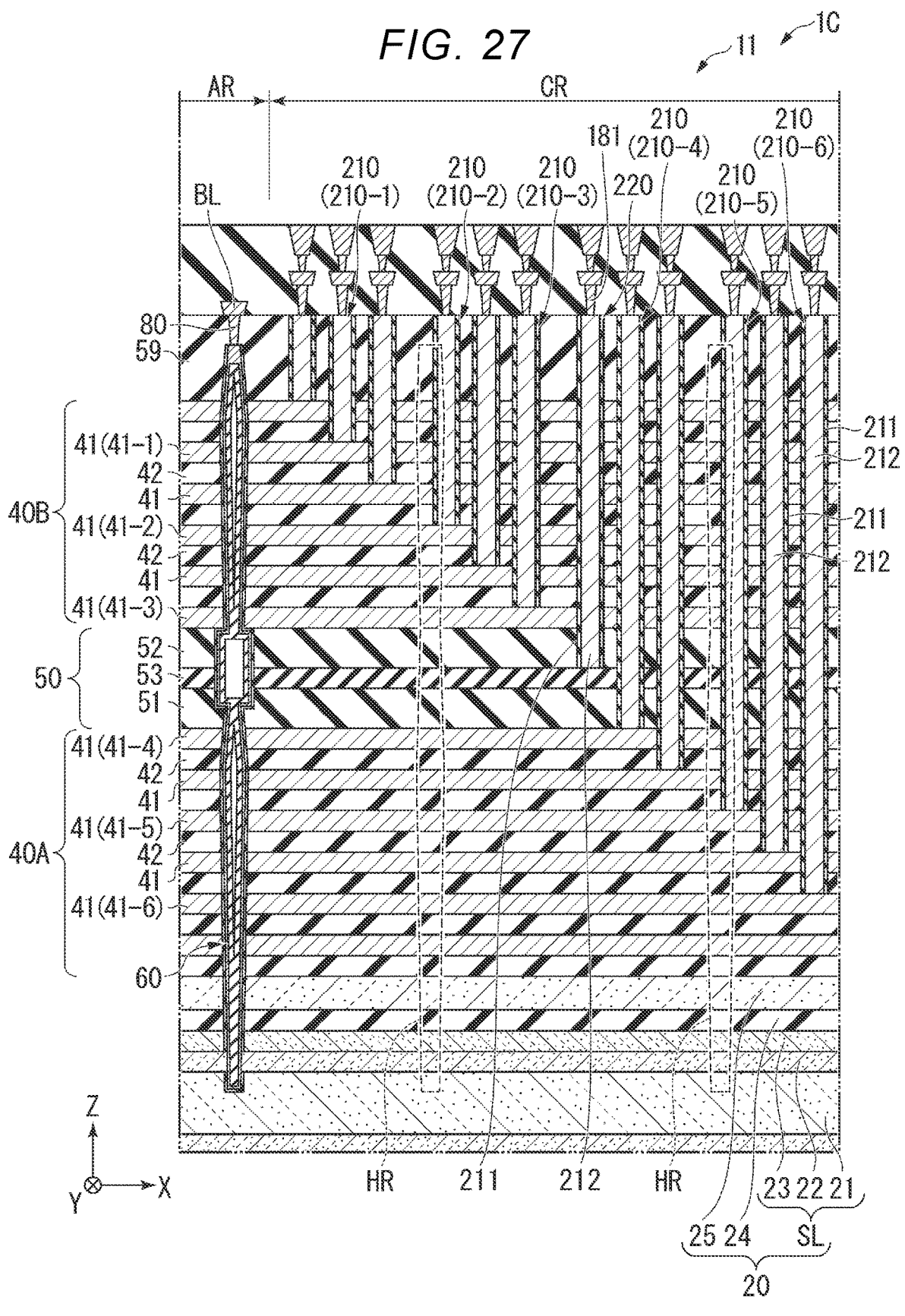
FIG. 27 is a sectional view showing a part of a semiconductor memory device according to a fourth embodiment.

FIG. 27 is a sectional view showing a part of a semiconductor memory device 1C of the fourth embodiment. In the present embodiment, X-direction lengths of a plurality of conductive layers 41 are identical to each other. For example, X-direction lengths of the six conductive layers 41-1, 41-2, 41-3, 41-4, 41-5, and 41-6 are identical to each other. In the present embodiment, X-direction lengths of the plurality of insulating layers 42 are identical to each other. X-direction lengths of the first layer 51, the second layer 52, and the third layer 53 of the interposed portion 50 are identical to each other.

The semiconductor memory device 1C of the present embodiment has a contact 210 instead of the contact 90 as a contact for the conductive layer. The contact 210 is an electrical connection portion that connects the conductive layer 41 to the wiring 101 in the upper wiring portion 100. A plurality of contacts 210 are provided in the contact region CR. The plurality of contacts 210 have different positions in the X direction. The plurality of contacts 210 extend in the Z direction and have different lengths in the Z direction. For example, the plurality of contacts 210 extend deeper in the Z direction as the contact 210 is located farther from the array region AR. A lower end of each contact 210 is connected to the corresponding conductive layer 41. In the present embodiment, two or more contacts 210 in the plurality of contacts 210 penetrate through the third layer 53 of the interposed portion 50 in the Z direction and reach the inside of the first stacked body 40A.

For example, the plurality of contacts 210 include a contact 210-1, a contact 210-2, and a contact 210-3. The contact 210-1 extends to the upper surface of the first conductive layer 41-1 and is in contact with the upper surface of the first conductive layer 41-1. The contact 210-2 extends downward longer than the contact 210-1. For example, the contact 210-2 penetrates through the first conductive layer 41-1 in the Z direction, extends to the upper surface of the second conductive layer 42-1, and is in contact with the upper surface of the second conductive layer 41-2. The contact 210-3 extends downward longer than the contact 210-2. For example, the contact 210-3 penetrates through the first and second conductive layers 41-1 and 41-2 in the Z direction, extends to the upper surface of the third conductive layer 42-3, and is in contact with the upper surface of the third conductive layer 42-3.

The plurality of contacts 210 include a contact 210-4, a contact 210-5, and a contact 210-6. The contact 210-4 extends downward longer than the contact 210-3. The contact 210-4 penetrates through the first to third conductive layers 41-1 to 41-3 and the interposed portion 50 in the Z direction, extends to the upper surface of the fourth conductive layer 41-4, and is in contact with the upper surface of the fourth conductive layer 41-4. The contact 210-5 extends downward longer than the contact 210-4. The contact 210-5 penetrates through the first to fourth conductive layers 41-1 to 41-4 and the interposed portion 50 in the Z direction, extends to the upper surface of the fifth conductive layer 41-5, and is in contact with the upper surface of the fifth conductive layer 41-5. The contact 210-6 extends downward longer than the contact 210-5. The contact 210-6 penetrates through the first to fifth conductive layers 41-1 to 41-5 and the interposed portion 50 in the Z direction, extends to the upper surface of the sixth conductive layer 41-6, and is in contact with the upper surface of the sixth conductive layer 41-6.

In the present embodiment, each contact 210 has a surface layer 211 and a conductive portion 212. The surface layer 211 is annular and located on the surface of the contact 210.

The surface layer 211 is made of an insulating material such as silicon oxide ($SiO_2$) and has insulating property. The surface layer 211 electrically isolates the conductive layer 41 through which the contact 210 penetrates from the conductive portion 212 of the contact 210. The conductive portion 212 is provided inside the surface layer 211. The conductive portion 212 is made of a conductive material such as tungsten, and has conductivity. The lower end of the conductive portion 212 is in contact with the upper surface of the conductive layer 41 that is a connection target, and is connected to the conductive layer 41 that is a connection target.

In the present embodiment, the contact region CR has at least one columnar body 220. The columnar body 220 extends in the Z direction. The columnar body 220 penetrates through the first to third conductive layers 41-1 to 41-3 and the second layer 52 of the interposed portion 50 in the Z direction, extends to the upper surface of the third layer 53 of the interposed portion 50, and is in contact with the upper surface of the third layer 53. The columnar body 220 has, for example, the same configuration as that of the contact 210. That is, the columnar body 220 has a surface layer 211 and a conductive portion 212. The columnar body 220 is electrically connected to the ground of the semiconductor memory device 1C via, for example, a contact 181 provided above the columnar body 220.

Next, a method of manufacturing the semiconductor memory device 1C of the fourth embodiment will be described.

Figure 28:
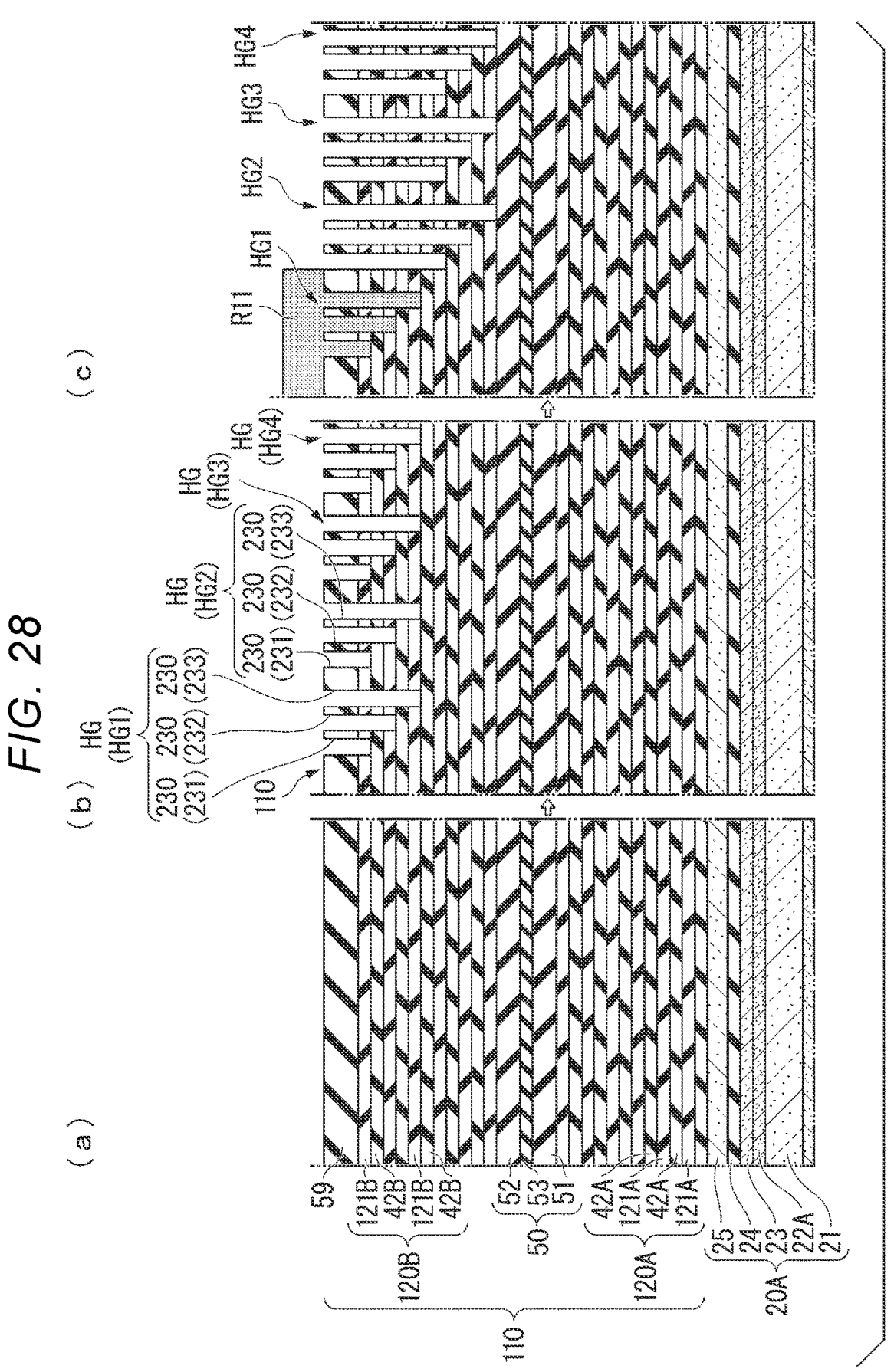
FIG. 28 is a sectional view showing a method of manufacturing the semiconductor memory device according to the fourth embodiment.
Figure 29:
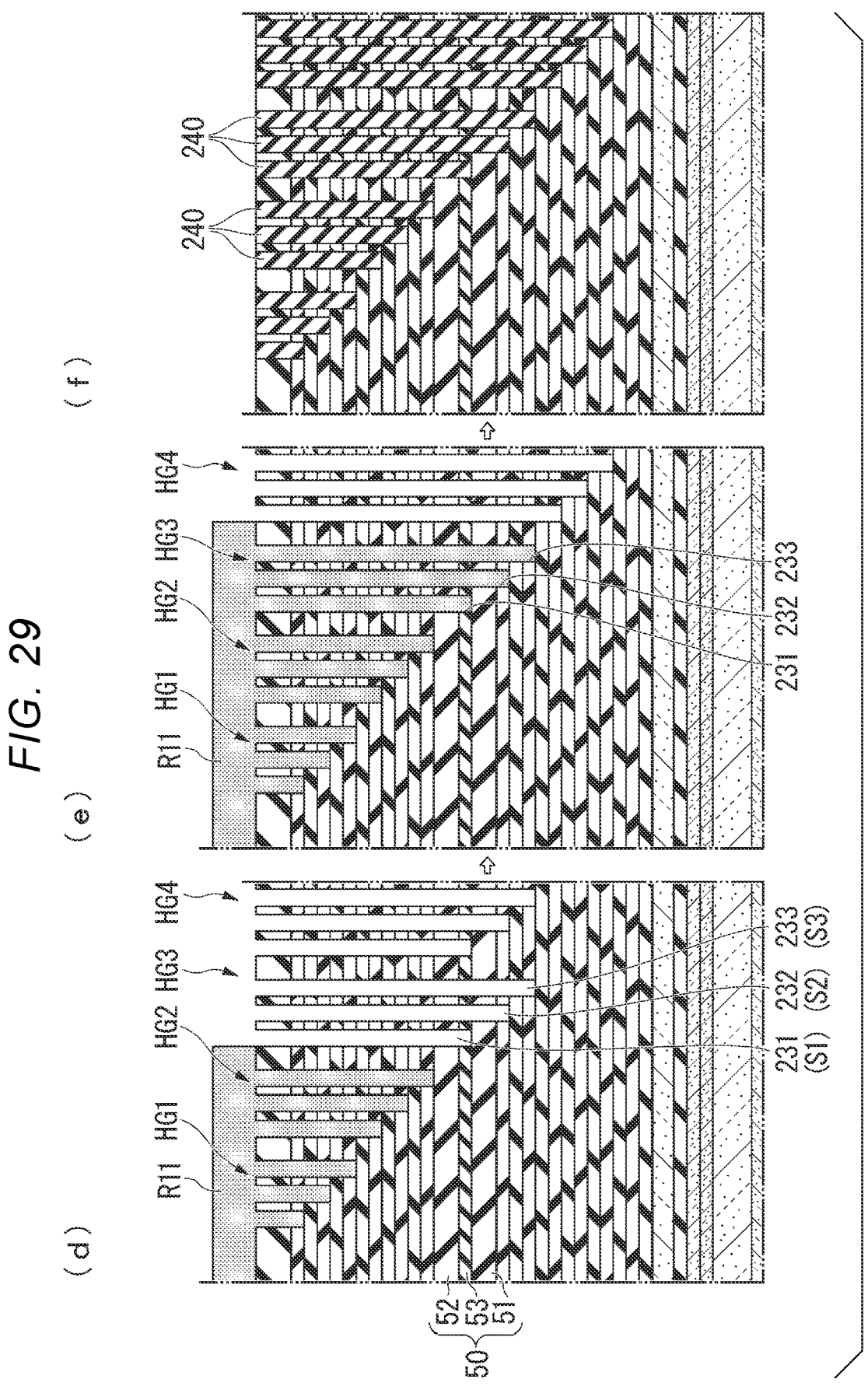
FIG. 29 is a sectional view showing the method of manufacturing the semiconductor memory device according to the fourth embodiment.

FIGS. 28 and 29 are sectional views showing the method of manufacturing the semiconductor memory device 1C. First, similarly to the first embodiment, the stacked body 110 is formed (refer to (a) in FIG. 28).

Next, a resist layer (not shown) is formed on the stacked body 110 and patterned to expose only any location of the upper surface of the stacked body 110, and anisotropic etching using the first etchant is repeatedly performed on the stacked body 110 to form a plurality of hole groups HG. The plurality of hole groups HG include, for example, a first hole group HG1, a second hole group HG2, a third hole group HG3, and a fourth hole group HG4 (refer to (b) in FIG. 28).

Each hole group HG has a plurality of holes 230 with different depths. The plurality of holes 230 in one hole group HG includes, for example, a first hole 231, a second hole 232, and a third hole 233. The second hole 232 extends downward longer than the first hole 231 by a depth corresponding to a total thickness of one insulating layer 42 and one sacrificial layer 121. The third hole 233 extends downward longer than the second hole 232 by a depth corresponding to a total thickness of one insulating layer 42 and one sacrificial layer 121.

Next, anisotropic etching using the first etchant is performed on the stacked body 110 in a state in which the insides of the plurality of holes 230 of the first hole group HG1 are filled with a sacrificial body R11 serving as a mask, and thus the plurality of holes 230 in the first hole group HG1, the second hole group HG2, the third hole group HG3, and the fourth hole group HG4 are made to extend downward by processing three layers of each of the insulating layers 42 and the sacrificial layers 121 (refer to (c) in FIG. 28). That is, in the present embodiment, the first hole 231, the second hole 232, and the third hole 233 in each hole group HG are collectively processed.

Next, anisotropic etching using the first etchant is performed on the stacked body 110 in a state in which the insides of the plurality of holes 230 of the first hole group HG1 and the second hole group HG2 are filled with the sacrificial body R11 serving as a mask, and thus the plurality of holes 230 in the third hole group HG3 and the fourth hole group HG4 are made to extend downward by processing three layers of each of the insulating layers 42 and the sacrificial layers 121 (refer to (d) in FIG. 29). In the example shown in FIG. 29, the first holes 231 of each of the third hole group HG3 and the fourth hole group HG4 penetrate through the second layer 52 of the interposed portion 50 and reach the third layer 53. In this processing, positions of the bottoms of the first holes 231 of each of the third hole group HG3 and the fourth hole group HG4 are restricted by the third layer 53.

Next, anisotropic etching using the first etchant is performed on the stacked body 110 in a state in which the insides of the plurality of holes 230 of the first hole group HG1, the second hole group HG2, and the third hole group HG3 are filled with the sacrificial body R11 serving as a mask, and thus the plurality of holes 230 in the fourth hole group HG4 are made to extend downward by processing three layers of each of the insulating layers 42 and the sacrificial layers 121 (refer to (e) in FIG. 29). Consequently, a plurality of holes 230 in which the contacts 210 and the columnar bodies 220 are formed are formed in the stacked body 110.

That is, in the present embodiment, the third layer 53 is provided in the interposed portion 50. The third layer 53 has characteristics closer to the sacrificial layer 121 than the first layer 51 and the second layer 52 with respect to the first etchant. Thus, the third layer 53 behaves similarly to the sacrificial layer 121 when the hole 230 reaching the interposed portion 50 is formed. Therefore, the third layer 53 serves as a stopper layer for the bottom of the hole 230, and thus it becomes easier to control a depth position of the bottom of the hole 230. For example, in the example shown in (d) in FIG. 29, the presence of the third layer 53 improves the accuracy of the height position of the bottom surface of the first hole 231 of each of the third hole group HG3 and the fourth hole group HG4.

Consequently, it becomes easier to form the bottoms of the plurality of holes 230 at target depth positions inside the interposed portion 50. As a result, even in a case where one hole 230 in the plurality of holes 230 is present in the interposed portion 50 when a plurality of holes 230 having different depths are collectively processed, differences in the depths of the plurality of holes 230 tend to be uniform. Therefore, the plurality of hole groups HG can be collectively processed over the first stacked body 40A, the second stacked body 40B, and the interposed portion 50.

In the present embodiment, the first hole 231 in the third hole group HG3 is an example of the "first space portion S1". The second hole 232 in the third hole group HG3 is an example of the "second space portion S2". The third hole 233 in the third hole group HG3 is an example of the "third space portion S3".

Thereafter, the sacrificial body 240 fills the plurality of holes 230 in each hole group HG (refer to (f) in FIG. 29). Thereafter, the replacement step (refer to (i) in FIG. 13 and (j) in FIG. 14) described in the first embodiment is performed. Thereafter, the sacrificial body 240 is removed and the conductive material is supplied to the plurality of holes 230 to form the contacts 210 and the columnar bodies 220.

Even with such a configuration, it is possible to improve the manufacturability in the same manner as in the first embodiment.

MODIFICATION EXAMPLES

Next, some modification examples will be described. The modification examples described below may be performed in combination with any of the configurations of the first to fourth embodiments described above.

First Modification Example

Figure 30:
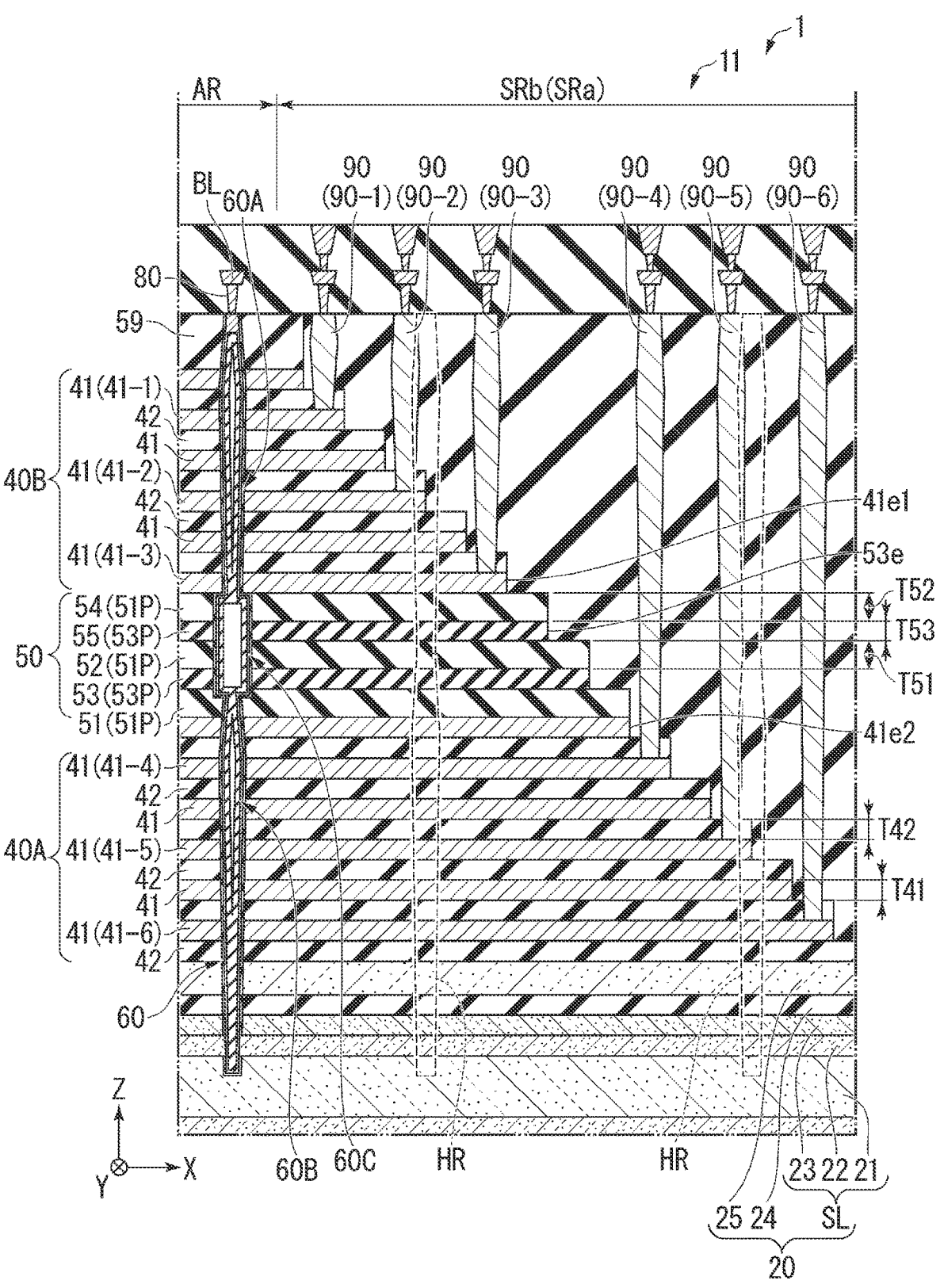
FIG. 30 is a sectional view showing a part of a semiconductor memory device according to a first modification example of the embodiment.

FIG. 30 is a sectional view showing a part of the semiconductor memory device 1 of the first modification example. In the present modification example, at least a part of the interposed portion 50 has a fourth layer 54 and a fifth layer 55 in addition to the first to third layers 51, 52, and 53.

The fourth layer 54 is disposed above the second layer 52 and located between the second layer 52 and the second stacked body 40B. The fourth layer 54 extends in the X and Y directions. The fourth layer 54 is an insulating layer containing the first insulating material (for example, silicon oxide). That is, the fourth layer 54 is made of the same insulating material as that of the first layer 51 and the second layer 52.

The fifth layer 55 is disposed between the second layer 52 and the fourth layer 54 in the Z direction. The fifth layer 55 extends in the X and Y directions. The fifth layer 55 is, for example, an insulating layer containing the second insulating material (for example, silicon carbonitride) in the same manner as in the first and second embodiments. That is, the fifth layer 55 is made of the same material as that of the third layer 53. Alternatively, the fifth layer may be made of a metal material in the same manner as in the third embodiment. Hereinafter, the third layer 53 and the fifth layer 55 will be referred to as "stopper layers 53P" when not distinguished from each other. Hereinafter, the first layer 51, the second layer 52, and the fourth layer 54 will be referred to as "insulating layers 51P" when not distinguished from each other.

According to the configuration of the present embodiment, even when the interposed portion 50 is thick, the plurality of stopper layers 53P are provided, and thus it is possible to reduce the influence of the interposed portion 50 in staircase multistage processing (first to third embodiments) and collective processing of a plurality of holes 230 (fourth embodiment). Consequently, it is possible to improve the manufacturability.

Three or more stopper layers 53P may be provided in the interposed portion 50. For example, a plurality of stopper layers 53P may be provided such that a Z-direction thickness of each insulating layer 51P is the same as a Z-direction thickness of the insulating layer 42.

Second Modification Example

Figure 31:
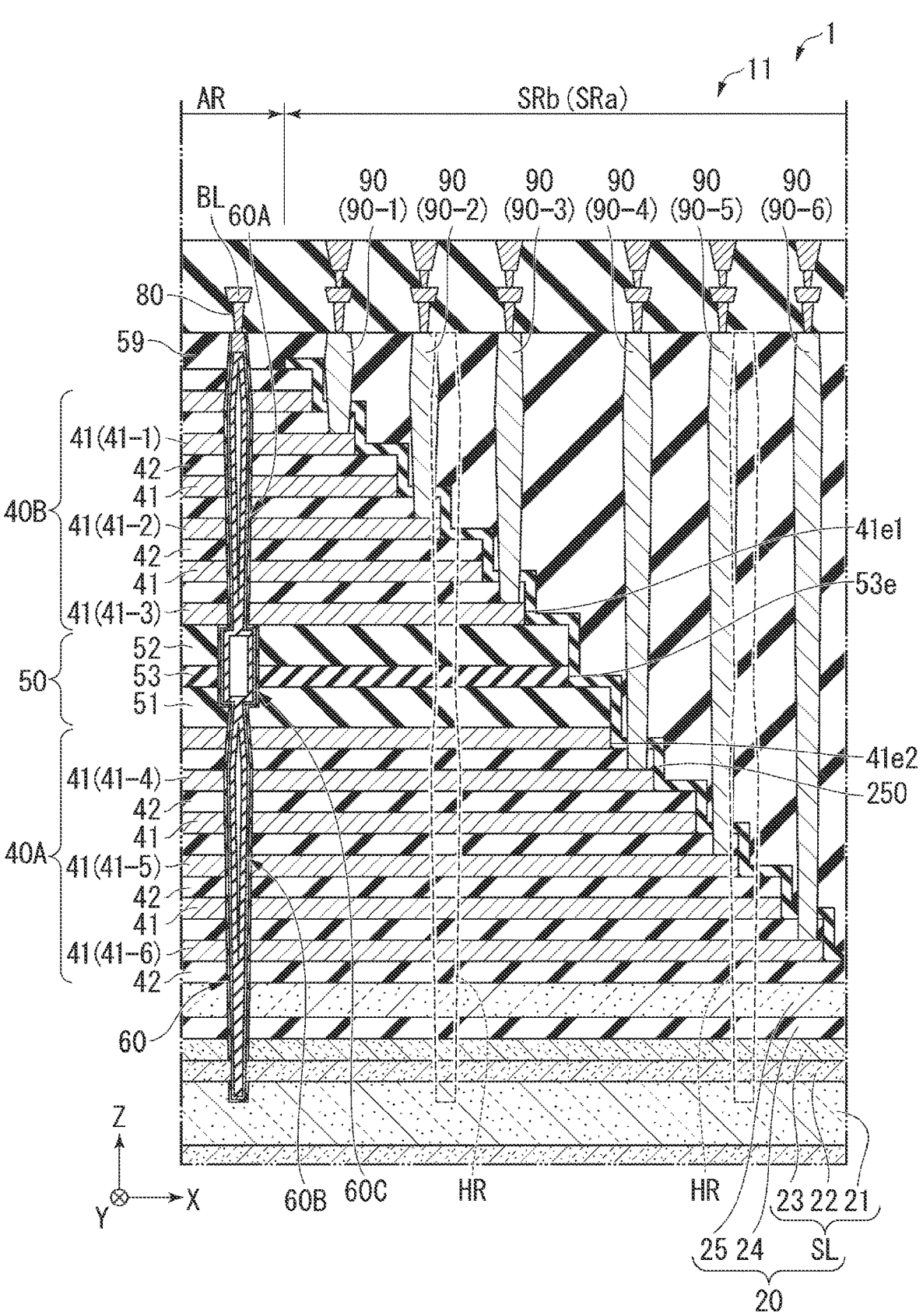
FIG. 31 is a sectional view showing a part of a semiconductor memory device according to a second modification example of the embodiment.

FIG. 31 is a sectional view showing a part of the semiconductor memory device 1 of the second modification example. In the present modification example, an insulating layer 250 is provided in the staircase regions SRa and SRb. The insulating layer 250 is formed in a staircase shape along the terrace portions 41t of the plurality of conductive layers 41. The insulating layer 250 is made of an insulating material such as silicon nitride (SiN). The insulating layer 250 functions as a stopper layer when processing the hole 145 for forming the contact 90.

With such a configuration, since the insulating layer 250 is provided, it becomes easier to control a position of the bottom of the hole 145 when processing the hole 145 for forming the contact 90. Consequently, it is possible to further improve the manufacturability.

Third Modification Example

Figure 32:
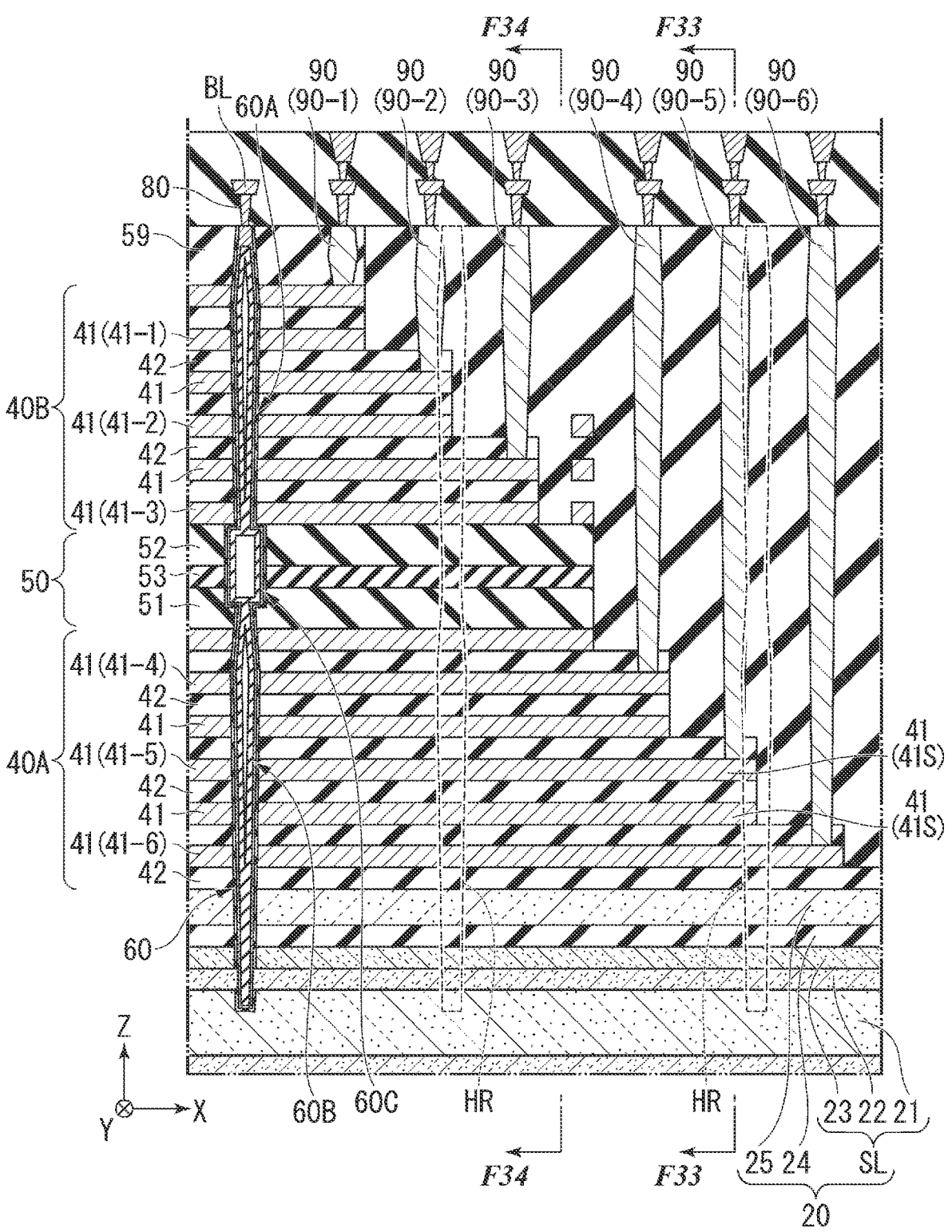
FIG. 32 is a sectional view showing a part of a semiconductor memory device according to a third modification example of the embodiment.

FIG. 32 is a sectional view showing a part of the semiconductor memory device 1 of the third modification example. In the present modification example, two conductive layers 41 (hereinafter, referred to as "conductive layers 41S" in some cases) adjacent in the Z direction have the same length in the X direction.

Figure 33:
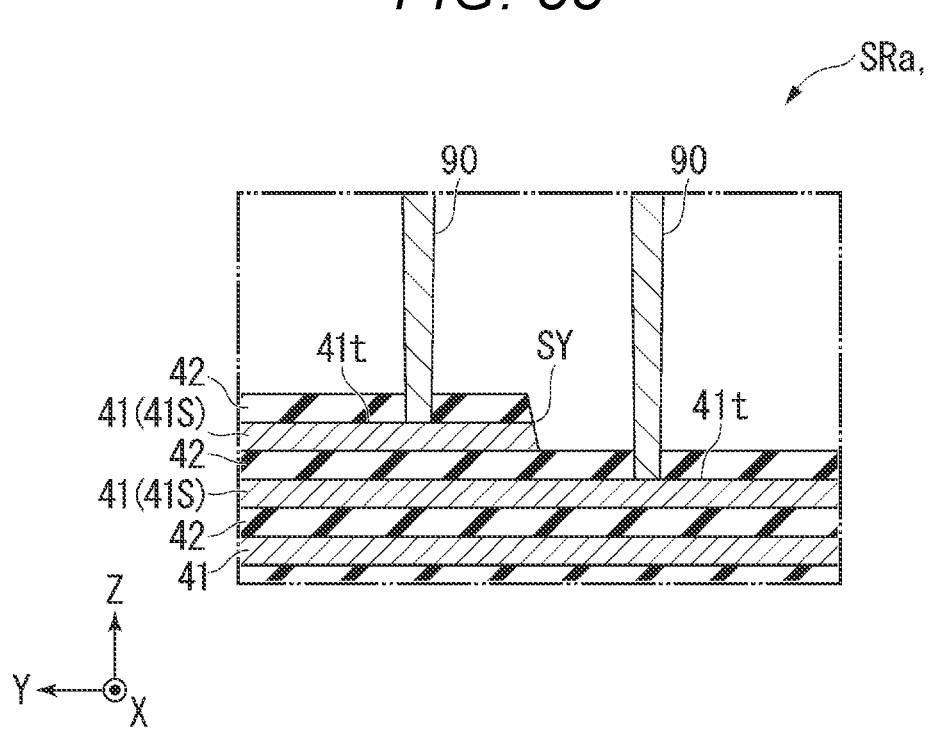
FIG. 33 is a sectional view along the line XXXIII-XXXIII of the semiconductor memory device shown in FIG. 32.

FIG. 33 is a sectional view of the semiconductor memory device 1 shown in FIG. 32 taken along line XXXIII-XXXIII. In the present modification example, two conductive layers 41S having the same length in the X direction have different lengths in the Y direction in the staircase regions SRa and SRb. Consequently, a step portion SY in the Y direction is formed. In the present embodiment, by forming the step portion SY in the Y direction, the terrace portion 41t of the lower conductive layer 41S of the two conductive layers 41S adjacent to each other in the Z-direction is formed.

Figure 34:
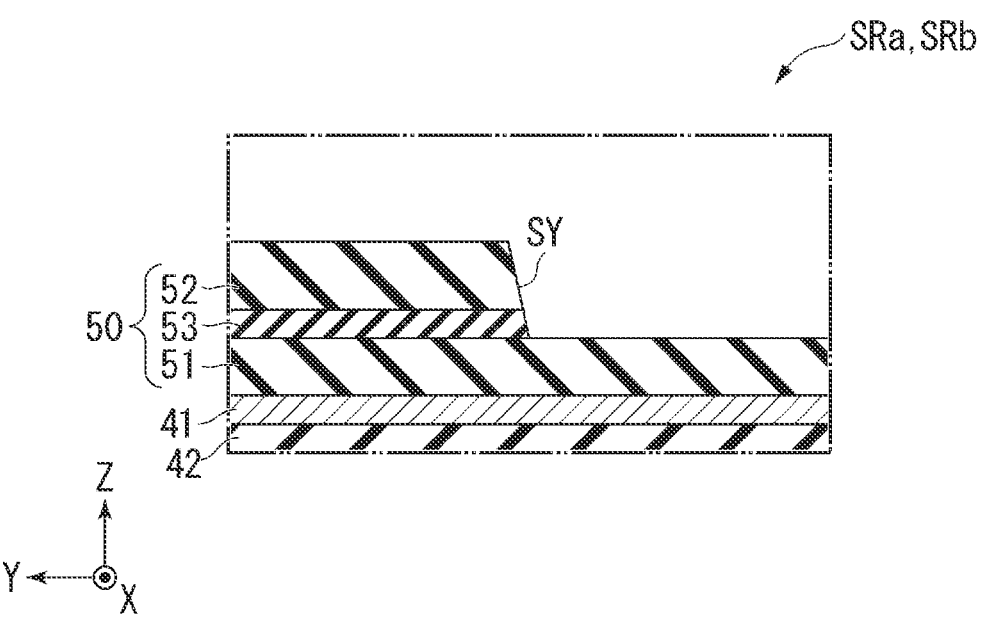
FIG. 34 is a sectional view along the line XXXIV-XXXIV of the semiconductor memory device shown in FIG. 32.

FIG. 34 is a sectional view taken along the line XXXIV-XXXIV of the semiconductor memory device 1 shown in FIG. 32. In the present modification example, the second layer 52 and the third layer 53 have different lengths in the Y direction with respect to the first layer 51 in the staircase regions SRa and SRb. That is, the second layer 52 and the third layer 53 have the step portion SY in the Y direction with respect to the first layer 51. In other words, in the present modification example, in the same manner as in the first embodiment, staircase multistage processing is performed over the first stacked body 40A, the second stacked body 40B, and the interposed portion 50, and the third layer 53 serves as a stopper layer. Thus, the step portion SY in the Y direction is also in the interposed portion 50.

With such a configuration, even in the staircase structure having the step portion SY in the Y direction, the third layer 53 is provided, and thus it is possible to improve the manufacturability in the same manner as in the above embodiments.

Although several embodiments and modification examples were described above, the embodiments and the modification examples are not limited to the examples described above. For example, the memory pillar 60 may be a memory pillar of three or more stages having two or more connection portions 60C instead of a memory pillar of two stages. In this case, the stacked body 30 has a plurality of interposed portions 50 each including the first layer 51, the second layer 52, and the third layer 53.

According to at least one embodiment described above, the semiconductor memory device has a first stacked body, a second stacked body, an interposed portion, and a columnar body. The interposed portion is disposed between the first stacked body and the second stacked body. The columnar body has a first columnar portion extending in a first direction in the first stacked body, a second columnar portion extending in the first direction in the second stacked body, and a connection portion disposed in the interposed portion and connecting the two columnar portions. At least a part of the interposed portion has a first layer containing a first insulating material, a second layer disposed between the first layer and the second stacked body in the first direction and containing the first insulating material, and a third layer disposed between the first layer and the second layer in the first direction and containing a first material different than the first insulating material. With such a configuration, it is possible to improve the manufacturability.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device comprising:

a first stacked body disposed in a first region and a second region when viewed from a first direction, the first stacked body including a plurality of first gate electrode layers and a plurality of first insulating layers alternately stacked one by one in the first direction;

a second stacked body disposed at a position different from a position of the first stacked body in the first direction, the second stacked body including a plurality of second gate electrode layers and a plurality of second insulating layers alternately stacked one by one in the first direction;

an interposed portion disposed between the first stacked body and the second stacked body in the first direction;

a columnar body having a channel layer and a memory film, the columnar body including a first columnar portion, a second columnar portion and a connection portion, the first columnar portion extending in the first direction inside the first stacked body, the second columnar portion extending in the first direction inside the second stacked body, and the connection portion disposed in the interposed portion, having a step, and connecting the first columnar portion to the second columnar portion, the step having different widths in a second direction intersecting the first direction between the connection portion and the second columnar portion, and is disposed in the first region;

a first contact disposed in the second region, in contact with one of the plurality of first gate electrode layers, and extending in the first direction; and a second contact disposed in the second region, in contact with one of the plurality of second gate electrode layers, and extending in the first direction, wherein the interposed portion having a thickness in the first direction larger than a thickness of the first insulating layer in both the first region and the second region, and at least a part of the interposed portion has
a first layer containing a first insulating material,
a second layer disposed between the first layer and the second stacked body in the first direction and containing the first insulating material, and
a third layer disposed between the first layer and the second layer in the first direction and containing a first material different from the first insulating material.

2. The semiconductor memory device according to claim 1, wherein
the first material is a second insulating material different from the first insulating material.

3. The semiconductor memory device according to claim 2, wherein
the second insulating material is an insulating material that has characteristics closer to silicon nitride than the first insulating material with respect to a first etchant, and has characteristics closer to the first insulating material than the silicon nitride with respect to a second etchant, the second etchant being different from the first etchant.

4. The semiconductor memory device according to claim 3, wherein
the first etchant is an etchant containing carbon and fluorine, and the second etchant is an etchant containing phosphoric acid.

5. The semiconductor memory device according to claim 2, wherein
the first insulating material contains oxygen, and
the second insulating material contains nitrogen.

6. The semiconductor memory device according to claim 5, wherein
the second insulating material contains carbon and nitrogen.

7. The semiconductor memory device according to claim 1, wherein
the first material is a metal material.

8. The semiconductor memory device according to claim 7, wherein
the metal material is the same as a metal material contained in the plurality of first gate electrode layers.

9. The semiconductor memory device according to claim 7, further comprising:
a contact disposed in the second region, extending in the first direction, and being in contact with the third layer.

10. The semiconductor memory device according to claim 1, wherein
the third layer is provided over the first region and the second region.

11. The semiconductor memory device according to claim 1, wherein
the interposed portion has a first portion located in the first region and a second portion located in the second region,
the second portion includes the first layer, the second layer, and the third layer, and
the first portion is made of the first insulating material.

12. The semiconductor memory device according to claim 1, wherein
when viewed from the first direction, an end of the third layer in the second direction is located between (i) an end of one first gate electrode layer in the second direction among the plurality of first gate electrode layers and (ii) an end of one second gate electrode layer in the second direction among the plurality of second gate electrode layers.

13. The semiconductor memory device according to claim 1, wherein
the second region further includes a plurality of contacts that penetrate through the third layer in the first direction and into the first stacked body.

14. The semiconductor memory device according to claim 1, wherein
at least part of the interposed portion has
a fourth layer disposed between the second layer and the second stacked body in the first direction, the fourth layer containing the first insulating material, and
a fifth layer disposed between the second layer and the fourth layer in the first direction, the fifth layer containing the first material.

15. A method of manufacturing a semiconductor memory device, the method comprising:
forming a stacked body including a first stacked body, a second stacked body, and an interposed portion, in which
in the first stacked body, a plurality of first films and a plurality of second films are alternately stacked one by one in a first direction,
the second stacked body is disposed at a position different from a position of the first stacked body in the first direction, and includes a plurality of third films and a plurality of fourth films alternately stacked one by one in the first direction, the interposed portion is disposed between the first stacked body and the second stacked body in the first direction, and at least a part of the interposed portion has a first layer containing:

a first insulating material, a second layer disposed between the first layer and the second stacked body in the first direction and containing the first insulating material, and a third layer disposed between the first layer and the second layer in the first direction and containing a first material different from the first insulating material; and collectively processing a first space portion reaching the third layer and a second space portion having a depth in the first direction larger than a depth of the first space portion and reaching one first film among the plurality of first films.

16. The method according to claim 15, wherein the first material is a second insulating material different from the first insulating material.

17. The method according to claim 16, wherein the second insulating material is an insulating material that has characteristics closer to silicon nitride than the first insulating material with respect to a first etchant, and has characteristics closer to the first insulating material than the silicon nitride with respect to a second etchant, the second etchant being different from the first etchant.

18. The method according to claim 17, wherein the first etchant is an etchant containing carbon and fluorine, and the second etchant is an etchant containing phosphoric acid.

19. The method according to claim 16, wherein the first insulating material contains oxygen, and the second insulating material contains nitrogen.

20. The method according to claim 19, wherein the second insulating material contains carbon and nitrogen.

\* \* \* \* \*